United States Patent
Fuji et al.

(10) Patent No.: US 7,776,387 B2
(45) Date of Patent: Aug. 17, 2010

(54) METHOD FOR MANUFACTURING A MAGNETO-RESISTANCE EFFECT ELEMENT

(75) Inventors: Yoshihiko Fuji, Kawasaki (JP); Hideaki Fukuzawa, Kawasaki (JP); Hiromi Yuasa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 11/802,474

(22) Filed: May 23, 2007

(65) Prior Publication Data

US 2008/0008909 A1 Jan. 10, 2008

(30) Foreign Application Priority Data

Jul. 7, 2006 (JP) ............... P2006-188711

(51) Int. Cl.
*B05D 5/12* (2006.01)

(52) U.S. Cl. ............ 427/127; 427/130; 427/131; 427/132

(58) Field of Classification Search ......... 427/127, 427/131, 132, 130; 428/811.3; 360/324
See application file for complete search history.

(56) References Cited

U.S. PATENT DOCUMENTS

| | | | |
|---|---|---|---|
| 5,936,402 A | 8/1999 | Schep et al. | |
| 6,469,926 B1 | 10/2002 | Chen | |
| 6,473,275 B1 | 10/2002 | Gill | |
| 6,937,446 B2 | 8/2005 | Kamiguchi et al. | |
| 6,937,447 B2 | 8/2005 | Okimo et al. | |
| 7,046,489 B2 | 5/2006 | Kamiguchi et al. | |
| 7,116,529 B2 | 10/2006 | Yoshikawa et al. | |
| 7,196,877 B2 | 3/2007 | Yoshikawa et al. | |
| 7,223,485 B2 | 5/2007 | Yuasa et al. | |
| 7,301,733 B1 * | 11/2007 | Fukuzawa et al. | 360/324.1 |
| 7,331,100 B2 | 2/2008 | Li et al. | |
| 7,379,278 B2 | 5/2008 | Koui et al. | |
| 7,390,529 B2 | 6/2008 | Li et al. | |
| 2001/0009063 A1 | 7/2001 | Saito et al. | |
| 2002/0048127 A1 | 4/2002 | Fukuzawa et al. | |

(Continued)

FOREIGN PATENT DOCUMENTS

CN 1431651 7/2003

(Continued)

OTHER PUBLICATIONS

Partial English machine translation for JP 2002-208744; JPO; 2009; pp. 1-29.*

(Continued)

*Primary Examiner*—Bret Chen
(74) *Attorney, Agent, or Firm*—Nixon & Vanderhye, PC

(57) ABSTRACT

A method for manufacturing a magneto-resistance effect element includes: forming a first magnetic layer; forming a first metallic layer, on the first magnetic layer, mainly containing an element selected from the group consisting of Cu, Au, Ag; forming a functional layer, on the first metallic layer, mainly containing an element selected from the group consisting of Si, Hf, Ti, Mo, W, Nb, Mg, Cr and Zr; forming a second metallic layer, on the functional layer, mainly containing Al; treating the second metallic layer by means of oxidizing, nitriding or oxynitiriding so as to form a current confined layer including an insulating layer and a current path with a conductor passing a current through the insulating layer; and forming, on the current confined layer, a second magnetic layer.

15 Claims, 13 Drawing Sheets

U.S. PATENT DOCUMENTS

| | | | |
|---|---|---|---|
| 2002/0048128 A1 | 4/2002 | Kamiguchi et al. | |
| 2002/0051380 A1 | 5/2002 | Kamiguchi et al. | |
| 2002/0054461 A1 | 5/2002 | Fujiwara et al. | |
| 2002/0058158 A1 | 5/2002 | Odagawa et al. | |
| 2002/0135935 A1 | 9/2002 | Covington | |
| 2002/0145835 A1* | 10/2002 | Suzuki et al. | 360/324.2 |
| 2003/0104249 A1* | 6/2003 | Okuno et al. | 428/693 |
| 2003/0123200 A1 | 7/2003 | Nagasaka et al. | |
| 2004/0021990 A1 | 2/2004 | Koui et al. | |
| 2004/0137645 A1* | 7/2004 | Hu et al. | 438/3 |
| 2004/0201929 A1 | 10/2004 | Hashimoto et al. | |
| 2005/0068855 A1* | 3/2005 | Morikawa et al. | 369/13.38 |
| 2006/0018057 A1* | 1/2006 | Huai | 360/324.2 |
| 2006/0034022 A1 | 2/2006 | Fukuzawa et al. | |
| 2006/0164764 A1 | 7/2006 | Kamiguchi et al. | |
| 2007/0188936 A1* | 8/2007 | Zhang et al. | 360/324.1 |
| 2007/0188937 A1* | 8/2007 | Carey et al. | 360/324.1 |
| 2009/0059441 A1* | 3/2009 | Zhang et al. | 360/324 |
| 2009/0091864 A1* | 4/2009 | Carey et al. | 360/324.11 |

FOREIGN PATENT DOCUMENTS

| | | |
|---|---|---|
| JP | 2000-293982 | 10/2000 |
| JP | 2001-143227 | 5/2001 |
| JP | 2002-076473 | 3/2002 |
| JP | 2002-208744 | 7/2002 |
| JP | 2004-153248 | 5/2004 |
| JP | 2004-214234 | 7/2004 |
| JP | 2006-319343 | 11/2006 |
| JP | 2007-221135 | 8/2007 |
| WO | 97-47982 | 12/1997 |

OTHER PUBLICATIONS

Office Action in Japanese Application No. 2006-188711, dated May 26, 2009 and partial English-language translation thereof.

N. Garcia, et al. "Magnetoresistance in Excess of 200% in Ballistic Ni Nanocontacts at Room Temperature and 100 Oe," Physical Review Letters, vol. 82, No. 14, Apr. 5, 1999, pp. 2923-2926. (Abstract).

J.J. Versluijs, et al., "Magnetoresistance of Half-Metallic Oxide Nanocontracts," Physical Review Letters, vol. 87, No. 2, Jul. 9, 2001, pp. 026601-1 through 026601-4. (Abstract).

Fukuzawa et al., "MR Ratio Enhancement by NOL Current-Confined-Path Structures in CPP Spin Values", IEEE Transactions on Magnetics, vol. 40, No. 4, pp. 2236-2238, Jul. 2004.

* cited by examiner

METHOD FOR MANUFACTURING A MAGNETO-RESISTANCE EFFECT ELEMENT

CROSS-REFERENCE TO RELATED APPLICATIONS

This application is based upon and claims the benefit of priority from the prior Japanese Patent Application No. 2006-188711, filed on Jul. 7, 2006; the entire contents of which are incorporated herein by reference.

BACKGROUND OF THE INVENTION

1. Field of the Invention

The present invention relates to a method for manufacturing a magneto-resistance effect element which is configured such that a current is flowed in the direction perpendicular to the film surface thereof to detect the magnetization of the element and the magneto-resistance effect element.

2. Description of the Related Art

Recently, the miniaturization and the high density recording of a hard disk drive (HDD) is remarkably required and being progressed. In the future, it is promised to much develop the high density recording of the HDD. The HDD of high density recording can be realized by narrowing the recording track width. However, the amplitude of the magnetization relating to the recording, that is, the recording signal may be lowered as the track width is narrowed, so that it is required that the reproducing sensitivity of the MR head for reproducing the medium signal is enhanced.

Recently, a GMR (Giant Magneto-Resistance effect) head with a high sensitive spin valve film using the GMR film is employed. The "spin valve" film has such a structure as sandwiching a non-magnetic metal spacer layer between two ferromagnetic layers. The stacking layer component structure exhibiting the change in resistance may be called as a "spin dependent scattering unit". The magnetization of one ferromagnetic layer (often called as a "pinning layer" or "fixed magnetization layer) is fixed by the magnetization of an anti-ferromagnetic layer and the magnetization of the other ferromagnetic layer (often called as a "free layer" or "free magnetization layer") is rotated in accordance with an external magnetic field. With the spin valve film, the intended large magneto-resistance effect can be obtained when the relative angle between the pinning layer and the free layer is changed.

A conventional spin valve film is formed as a CIP (Current In Plane)-GMR element, a CPP (Current Perpendicular to Plane)-GMR element and a TMR (Tunneling Magneto-Resistance) element. With the CIP-GMR element, a sense current is flowed along the film surface of the spin valve film. With the CPP-GMR element or the TMR element, a sense current is flowed in the direction perpendicular to the film surface thereof.

With the element which is utilized by flowing the sense current in the direction perpendicular to the film surface, the spacer layer is made of an insulating layer in the TMR element and of a metallic layer in the CPP-GMR element.

Herein, a metal CPP-GMR element of which the spin valve film is made of a metallic layer has a smaller change in resistance to render the detection of minute magnetic field difficult.

A CPP element with an oxide layer containing current confined paths in the thickness direction thereof, which is called as an "NOL (nano-oxide layer)", is proposed (refer to Document 1). With the CPP element, both of the element resistance and the MR ratio can be increased due to the current confined to path (CCP) effect. Hereinafter, the element is called as a "CCP-CPP element".

[Document No. 1] JP-A 2002-208744 (KOKAI)

Such a magnetic recording device as the HDD is widely available for a personal computer, a portable music player and the like. In the future, however, the reliability of the magnetic recording device is severely required when the usage of the magnetic recording device is increased and the high density recording is also developed. It is required, for example, that the reliability of the magnetic recording device is developed under a high temperature condition or a high speed operation. In this point of view, it is desired to much develop the reliability of the magnetic head in comparison with the conventional one.

Particularly, since the CCP-CPP element has a smaller resistance than the one of the conventional TMR element, the CCP-CPP element can be applied for a high end magnetic recording device of server enterprise requiring higher transfer rate. In the use of the high end magnetic recording device, both of the high density recording and the high reliability must be satisfied. Also, the high reliability under a higher temperature condition must be preferably satisfied. In other words, the CCP-CPP element is required to be used under the more severe condition (e.g., high temperature condition) and the more severe operation (e.g., the information being read out while the magnetic disk is rotated at high speed).

BRIEF SUMMARY OF THE INVENTION

An aspect of the present invention relates to a method for manufacturing a magneto-resistance effect element, including: forming a first magnetic layer; forming a first metallic layer, on the first magnetic layer, mainly containing an element selected from the group consisting of Cu, Au, Ag; forming a functional layer, on the first metallic layer, mainly containing an element selected from the group consisting of Si, Hf, Ti, Mo, W, Nb, Mg, Cr and Zr; forming a second metallic layer, on the functional layer, mainly containing Al; treating the second metallic layer by means of oxidizing, nitriding or oxynitiriding so as to form a current confined layer including an insulating layer and a current path with a conductor passing a current through the insulating layer; and forming, on the current confined layer, a second magnetic layer.

Another aspect of the present invention relates to a method for manufacturing a magneto-resistance effect element, including: forming a first magnetic layer; forming a first metallic layer, on the first magnetic layer, mainly containing an element selected from the group consisting of Cu, Au, Ag; forming a second metallic layer, on the first metallic layer, mainly containing Al; forming a functional layer, on the second metallic layer, mainly containing an element selected from the group consisting of Si, Hf, Ti, Mo, W, Nb, Mg, Cr and Zr; treating the second metallic layer and the functional layer by means of oxidizing, nitriding or oxynitiriding so as to form a current confined layer including an insulating layer and a current path with a conductor passing a current through the insulating layer; and forming, on the current confined layer, a second magnetic layer.

Still another aspect of the present invention relates to a method for manufacturing a magneto-resistance effect element, including: forming a first magnetic layer; forming a first metallic layer, on the first magnetic layer, mainly containing an element selected from the group consisting of Cu, Au, Ag; forming a second metallic layer, on the first metallic layer, mainly containing Al; treating the second metallic layer by means of oxidizing, nitriding or oxynitiriding so as to form a current confined layer including an insulating layer and a current path with a conductor passing a current through the insulating layer; forming a functional layer, on the current confined layer, mainly containing an element selected from the group consisting of Al, Si, Hf, Ti, Mo, W, Nb, Mg, Cr and Zr; and forming, on the functional layer, a second magnetic layer.

A further aspect of the present invention relates to a method for manufacturing a magneto-resistance effect element, including: forming a first magnetic layer; forming a first metallic layer, on the first magnetic layer, mainly containing an element selected from the group consisting of Cu, Au, Ag; forming a first functional layer, on the first metallic layer, mainly containing an element selected from the group consisting of Si, Hf, Ti, Mo, W, Nb, Mg, Cr and Zr; forming a second metallic layer, on the first functional layer, mainly containing Al; forming a second functional layer, on the second metallic layer, mainly containing an element selected from the group consisting of Si, Hf, Ti, Mo, W, Nb, Mg, Cr and Zr; treating the second functional layer and the second metallic layer by means of oxidizing, nitriding or oxynitiriding so as to form a current confined layer including an insulating layer and a current path with a conductor passing a current through the insulating layer; and forming, on the current confined layer, a second magnetic layer.

A still further aspect of the present invention relates to a method for manufacturing a magneto-resistance effect element, including: forming a first magnetic layer; forming a first metallic layer, on the first magnetic layer, mainly containing an element selected from the group consisting of Cu, Au, Ag; forming a first functional layer, on the first metallic layer, mainly containing an element selected from the group consisting of Si, Hf, Ti, Mo, W, Nb, Mg, Cr and Zr; forming a second metallic layer, on the first functional layer, mainly containing Al; treating the second metallic layer by means of oxidizing, nitriding or oxynitiriding so as to form a current confined layer including an insulating layer and a current path with a conductor passing a current through the insulating layer; forming a second functional layer, on said current confined layer, mainly containing an element selected from the group consisting of Al, Si, Hf, Ti, Mo, W, Nb, Mg, Cr and Zr; and forming, on the second functional layer, a second magnetic layer.

DETAILED DESCRIPTION OF THE INVENTION

Figure 1:
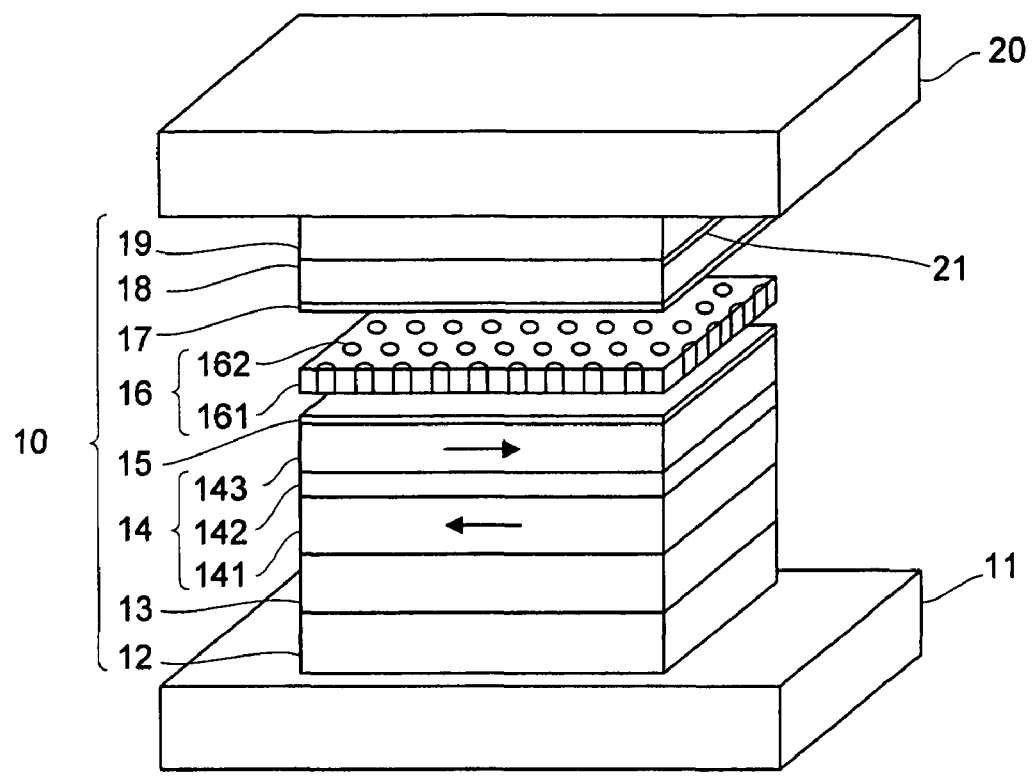
FIG. 1 is a perspective view illustrating an embodiment of the magneto-resistance effect element according to the present invention.

The inventors had intensely studied to achieve the above object. As a result, the inventors found out the following facts of the matter. In the CCP-CPP type magneto-resistance effect element, the reliability of the element depends particularly on the adhesion between the insulating layer (CCP-NOL) composing the spacer layer and the adjacent metallic layer composing the same spacer layer or the adjacent magnetic layer. In this case, when a current is flowed in the stacking direction through the CCP-CPP type magneto-resistance effect element under operation, one or more layers may be peeled off and the properties of one or more layers may be deteriorated at the corresponding interface(s) therebetween in which the current density is increased, which affects the spin-dependent conduction and the reliability of the element to no small extent.

In this point of view, the inventors found out that if the functional layer with large adhesion is formed at the one or more interfaces affecting the deterioration in property of the layers composing the element, the adhesion at the interface(s) can be enhanced so as to develop the reliability of the element. According to the embodiment, therefore, the intended CCP-CPP type magneto-resistance effect element with high reliability can be provided.

The enhancement of the reliability of the element can contribute to the enhancement of the damage robustness and heat robustness of the element under various condition in addition to the manufacture of the HDD. As a result, the magneto-resistance effect element can be applied for a server and a head of enterprise requiring high reliability. The high reliability magnetic head with another feature except high density recording becomes important in technology advances of recent years as the use application of HDD is increased. The long lifetime of magnetic head becomes very important in view of the enlargement of the use application of HDD. The high reliability magnetic head becomes very effective for an HDD in a car navigation system requiring a severe thermal condition.

The high reliability magnetic head can be employed for an HDD in such a household electronic appliance as a normal personal computer, a portable music player or a cellular phone in addition to the high-value added HDD.

As described above, the functional layer with adhesion may be composed of a single layer or a plurality of layers which are separated from one another. The number of layer constituting the functional layer can be determined on the adhesion requiring for the corresponding interface(s).

The formation process of the functional layer is appropriately controlled in accordance with the number of layer composing the functional layer to be formed at the corresponding interface(s).

In an embodiment, an additional metallic layer mainly containing an element selected from the group consisting of Cu, Au, Ag may be formed on the current confined layer or on the functional layer. The additional metallic layer functions as a barrier layer to prevent the deterioration of the second magnetic layer located above the spacer layer through the prevention of the diffusion of oxygen and nitrogen contained in the insulating layer (CCP-NOL layer) of the spacer layer into the second magnetic layer, and as a seed layer to enhance the crystallinity of the second magnetic layer.

The thickness of the functional layer may be set within 0.1 to 0.5 nm. Then, the treatment through oxidizing, nitriding or oxynitiriding may be conducted under ion beam irradiation or plasma contact.

According to the aspects of the present invention can be provided a magneto-resistance effect element which can be applied for a magnetic recording device of high density recording and develop the reliability and the method for manufacturing the same magneto-resistance effect element.

Hereinafter, the present invention will be described in detail with reference to the drawings.

(Magneto-Resistance Effect Element)

FIG. 1 is a perspective view illustrating a magneto-resistance effect element (CCP-CPP type element) according to an embodiment of the present invention. Some or all components throughout the drawings in the present application are schematically illustrated so that the illustrated thickness ratio for the components is different from the real thickness ratio for the components.

The magneto-resistance effect element illustrated in FIG. 1 includes a magneto-resistance effect element 10, a top electrode 11 and a bottom electrode 20 which are disposed so as to sandwich the magneto-resistance effect element 10. Herein, the illustrated stacking structure is formed on a base (not shown).

The magneto-resistance effect element 10 includes an underlayer 12, a pinning layer 13, a pinned layer 14, a bottom metallic layer 15, a CCP-NOL layer 16 (an insulating layer 161 and a current path 162), a top metallic layer 17, a free layer 18 and a cap layer 19 which are subsequently stacked and formed. Among them, the pinned layer 14, the bottom metallic layer 15, the CPP-NOL layer 16, the top metallic layer 17 and the free layer 18 constitute a spin valve film which is configured such that the non-magnetic spacer layer is sandwiched between the two ferromagnetic layers. The bottom metallic layer 15, the CCP-NOL layer 16 and the top metallic layer 17 constitute the spacer layer entirely. For clarifying the structural feature of the magneto-resistance effect element, the extreme thin oxide layer 16 is represented under the condition that the thin oxide layer 16 is separated from the upper and lower layers (the bottom metallic layer 15 and the top metallic layer 17).

Then, the components of the magneto-resistance effect element will be described. The bottom electrode 11 functions as an electrode for flowing a current in the direction perpendicular to the spin valve film. In real, the current can be flowed through the spin valve film in the direction perpendicular to the film surface thereof by applying a voltage between the bottom electrode 11 and the top electrode 20. The change in resistance of the spin valve film originated from the magneto-resistance effect can be detected by utilizing the current. In other words, the magnetization detection can be realized by the current flow. The bottom electrode 11 is made of a metallic layer with a relatively small electric resistance for flowing the current to the magneto-resistance effect element sufficiently.

The underlayer 12 may be composed of a buffer layer 12a and a seed layer 12b. The buffer layer 12a can be employed for the compensation of the surface roughness of the bottom electrode 11. The seed layer 12b can be employed for controlling the crystalline orientation and the crystal grain size of the spin valve film to be formed on the underlayer 12.

The buffer layer 12a may be made of Ta, Ti, W, Zr, Hf, Cr or an alloy thereof. The thickness of the buffer layer 12a is preferably set within 2 to 10 nm, more preferably set within 3 to 5 nm. If the buffer layer 12a is formed too thin, the buffer layer 12a can exhibit the inherent buffering effect. If the buffer layer 12a is formed too thick, the Series resistance not contributing to the MR may be increased. If the seed layer 12b can exhibit the buffering effect, the buffer layer 12a may be omitted. In a preferable example, the buffer layer 12a is made of a Ta layer with a thickness of 3 nm.

The seed layer 12b may be made of any material controllable for the crystalline orientation of (a) layer(s) to be formed thereon. For example, the seed layer 12b may be made preferably of a metallic layer with a fcc-structure (face-centered cubic structure), a hcp-structure (hexagonal close-packed structure) or a bcc-structure (body-centered cubic structure). Concretely, the seed layer 12b may be made of Ru with hcp-structure or NiFe with fcc-structure so that the crystalline orientation of the spin valve film to be formed thereon can be rendered an fcc (111) faced orientation. In this case, the crystalline orientation of the pinning layer 13 (e.g., made of PtMn) can be rendered an fct-structure (face-centered tetragonal structure)-regulated orientation or a bcc (110) faced orientation.

In order to exhibit the inherent seeding function of the seed layer 12b of enhancing the crystalline orientation sufficiently, the thickness of the seed layer 12b is set preferably within 1 to 5 nm, more preferably within 1.5 to 3 nm. In a preferable example, the seed layer 12b may be made of a Ru layer with a thickness of 2 nm.

The crystalline orientation for the spin valve film and the pinning layer 13 can be measured by means of X-ray diffraction. For example, the FWHMs (full width at half maximum) in X-ray rocking curve of the fcc (111) peak of the spin valve film, the fct (111) peak or the bcc (110) peak of the pinning layer 13 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 12b may be made of a NiFe-based alloy (e.g., $Ni_xFe_{100-x}$: X=90 to 50%, preferably 75 to 85%) layer of a NiFe-based non-magnetic (($Ni_xFe_{100-x})_{100-y}X_y$: X=Cr, V, Nb, Hf, Zr, Mo)) layer. In the latter case, the addition of the third element "X" renders the seed layer 12b non-magnetic. The crystalline orientation of the seed layer 12b of the NiFe-based alloy can be enhanced easily so that the FWHM in X-ray rocking curve can be rendered within a range of 3 to 5 degrees.

The seed layer 12b functions not only as the enhancement of the crystalline orientation, but also as the control of the crystal grain size of the spin valve film. Concretely, the crystal grain size of the spin valve film can be controlled within a range of 5 to 40 nm so that the fluctuation in performance of the magneto-resistance effect element can be prevented, and thus, the higher MR ratio can be realized even though the magneto-resistance effect element is downsized.

The crystal grain size of the spin valve film can be determined on the crystal grain size of the layer formed on the seed layer 12b by means of cross section TEM. In the case of a bottom type spin valve film where the pinning layer 14 is located below the spacer layer 16, the crystal grain size of the spin valve film can be determined on the crystal grain size of the pinning layer 13 (antiferromagnetic layer) or the pinned layer 14 (fixed magnetization layer) to be formed on the seed layer 12b.

With a reproducing head in view of high recording density, the element size is set to 100 nm or below, for example. Therefore, if the crystal grain size is set larger for the element size, the element characteristics may be fluctuated. In this point of view, it is not desired that the crystal grain size of the spin valve film is set larger than 40 nm. Concretely, the crystal grain size of the spin valve film is set preferably within 5 to 40 nm, more preferably within 5 to 20 nm.

Too large crystal grain size may cause the decrease of the number of crystal grain per element surface so as to cause fluctuation in characteristics of the reproducing head. With the CCP-CPP element forming a current path, it is not desired to increase the crystal grain size than a prescribed grain size. In contrast, too small crystal grain size may deteriorate the crystalline orientation. In this point of view, it is required that the crystal grain size is determined in view of the upper limited value and the lower limited value, e.g., within a range of 5 to 20 nm.

With the use of MRAM, however, the element size may be increased to 100 nm or over so that the crystal grain size can be increased to about 40 nm without the above-mentioned problem. Namely, if the seed layer 12b is employed, the crystal grain size may be increased than the prescribed grain size.

In order to set the crystal grain size within 5 to 20 nm, the seed layer 12b may be made of a Ru layer with a thickness of 2 nm or a NiFe-based non-magnetic (($Ni_XFe_{100-X})_{100-Y}X_Y$: X=Cr, V, Nb, Hf, Zr, Mo, preferably y=0 to 30%)) layer.

In contrast, in the case that the crystal grain size is increased more than 40 nm and thus, is rendered coarse, the content of the third additive element is preferably increased more than the value described above. For example, with NiFeCr alloy, the content of Cr is preferably set within 35 to 45% so as to set the composition of the NiFeCr alloy to the composition exhibiting intermediate phase structure between the fcc-structure and the bcc-structure. In this case, the resultant NiFeCr layer can have the bcc-structure.

As described above, the thickness of the seed layer 12b is set preferably within 1 to 5 nm, more preferably within 1.5 to 3 nm. Too thin seed layer 12b may deteriorate the crystalline orientation controllability. In contrast, too thick seed layer 12b may increase the Series resistance of the element and rough the interface for the spin valve film.

The pinning layer 13 functions as applying the unidirectional anisotropy to the ferromagnetic layer to be the pinned layer 14 on the pinning layer 13 and fixing the magnetization of the pinned layer 14. The pinning layer 13 may be made of an antiferromagnetic material such as PtMn, PdPtMn, IrMn, RuRhMn, FeMn, NiMn. In view of the use of the element as a high density recording head, the pinning layer 13 is preferably made of IrMn because the IrMn layer can apply the unidirectional anisotropy to the pinned layer 14 in comparison with the PtMn layer even though the thickness of the IrMn layer is smaller than the thickness of the PtMn layer. In this point of view, the use of the IrMn layer can reduce the gap width of the intended element for high density recording.

In order to apply the unidirectional anisotropy with sufficient intensity, the thickness of the pining layer 13 is appropriately controlled. In the case that the pinning layer 13 is made of PtMn or PdPtMn, the thickness of the pinning layer 13 is set preferably within 8 to 20 nm, more preferably within 10 to 15 nm. In the case that the pinning layer 13 is made of IrMn, the unidirectional anisotropy can be applied even though the thickness of the pinning layer 13 of IrMn is set smaller than the thickness of the pinning layer 13 of PtMn. In this point of view, the thickness of the pinning layer 13 of IrMn is set preferably within 4 to 18 nm, more preferably within 5 to 15 nm. In a preferred embodiment, the thickness of the IrMn pinning layer 13 is set to 10 nm.

The pinning layer 13 may be made of a hard magnetic layer instead of the antiferromagnetic layer. For example, the pinning layer 13 may be made of CoPt (Co=50 to 85%), ($CoPt_{100-X})_{100-Y}Cr_Y$: X=50 to 85%, Y=0 to 40%) or FePt (Pt=40 to 60%). Since the hard magnetic layer has a smaller specific resistance, the Series resistance and the Area Resistance RA of the element can be reduced.

In a preferred embodiment, the pinned layer (fixed magnetization layer) 14 is formed as a synthetic pinned layer composed of the bottom pinned layer 141 (e.g., $Co_{90}Fe_{10}$ 3.5 nm), the magnetic coupling layer 142 (e.g., Ru) and the top pinned layer 143 (e.g., $Fe_{50}Co_{50}$ 1 nm/Cu 0.25 nm×2/$Fe_{50}Co_{50}$ 1 nm). The pinning layer 13 (e.g., IrMn layer) is coupled via magnetic exchange with the bottom pinned layer 141 formed on the pinning layer 13 so as to apply the unidirectional anisotropy to the bottom pinned layer 141. The bottom pinned layer 141 and the top pinned layer 143 which are located under and above the magnetic coupling layer 142, respectively, are strongly magnetically coupled with one another so that the direction of magnetization in the bottom pinned layer 141 becomes anti-paralleled to the direction of magnetization in the top pinned layer 143.

The bottom pinned layer 141 may be made of $Co_XFe_{100-X}$ alloy (X=0 to 100), $Ni_XFe_{100-X}$ (x=0 to 100) or an alloy thereof containing a non magnetic element. The bottom pinned layer 141 may be also made of a single element such as Co, Fe, Ni or an alloy thereof.

It is desired that the magnetic thickness (saturated magnetization Bs×thickness t (B·t)) of the bottom pinned layer 141 is set almost equal to the one of the top pinned layer 143. Namely, it is desired that the magnetic thickness of the top pinned layer 143 corresponds to the magnetic thickness of the bottom pinned layer 141. For example, when the top pinned layer 143 of $Fe_{50}Co_{50}$ 1 nm/Cu 0.25 nm×2/$Fe_{50}Co_{50}$ 1 nm is employed, the magnetic thickness of the top pinned layer 143 is set to 2.2 T×3 nm=6.6 T nm because the saturated magnetization of the top pinned layer 143 is about 2.2 T. When the bottom pinned layer 141 of $Co_{90}Fe_{10}$ is employed, the thickness of the bottom pinned layer 141 is set to 6.6T nm/1.8 T=3.66 nm for the magnetic thickness of 6.6T nm because the saturated magnetization of $Co_{90}Fe_{10}$ is about 1.8T. In this point of view, it is desired that the thickness of the bottom pinned layer 141 made of $Co_{90}Fe_{10}$ is set to about 3.6 nm.

The thickness of the bottom pinned layer 141 is preferably set within 2 to 5 nm in view of the magnetic strength of the unidirectional anisotropy relating to the pinning layer 13 (e.g., IrMn layer) and the magnetic strength of the antiferromagnetic coupling between the bottom pinned layer 141 and the top pinned layer 143 via the magnetic coupling layer 142 (e.g., Ru layer). Too thin bottom pinned layer 141 causes the decrease of the MR ratio. In contrast, too thick bottom pinned layer 141 causes the difficulty of obtaining the unidirectional anisotropy magnetic field requiring for the operation of the element. In a preferred embodiment, the bottom pinned layer 141 may be made of a $Co_{90}Fe_{10}$ layer with a thickness of 3.4 nm.

The magnetic coupling layer 142 (e.g., Ru layer) causes the antiferromatic coupling between the bottom pinned layer 141 and the top pinned layer 143 which are located under and above the magnetic coupling layer 142. In the case that the magnetic coupling layer 142 is made of the Ru layer, the thickness of the Ru layer is preferably set within 0.8 to 1 nm. Only if the antiferromagnetic coupling between the pinned layers located under and above the magnetic coupling layer 142 can be generated, the magnetic coupling layer 142 may be made of another material except Ru or the thickness of the magnetic coupling layer 142 may be varied within 0.3 to 0.6 nm instead of the thickness range of 0.8-1 nm. The former thickness range of 0.3 to 0.6 nm corresponds to the first peak of RKKY (Runderman-Kittel-Kasuya-Yoshida), and the latter thickness range of 0.8 to 1 nm corresponds to the second peak of RKKY. With the thickness range of the first peak of RKKY, the magnetic coupling layer 142 can exhibit an extremely large antiferromagnetic fixing strength, but the allowable thickness range of the magnetic coupling layer 142 is reduced. In a preferred embodiment, the magnetic coupling layer 142 may be made of the Ru layer with a thickness of 0.9 nm so as to realize the antiferromagnetic coupling for the pinned layers stably.

The top pinned layer 143 may be made of $Fe_{50}Co_{50}$ 1 nm/Cu 0.25 nm×2/$Fe_{50}Co_{50}$ 1 nm. The top pinned layer 143 composes the spin dependent scattering unit. The top pinned layer 143 can contribute directly to the MR effect, and thus, the material and thickness of the top pinned layer 143 are important so as to realize a large MR ratio. The magnetic material of the top pinned layer 143 to be positioned at the interface for the CCP-NOL layer 16 is important in view of the contribution of the spin dependent interface scattering.

Then, the effect/function of the top pinned layer 143 of the $Fe_{50}Co_{50}$ layer with bcc-structure will be described. In this case, since the spin dependent interface scattering is enhanced, the MR ratio can be enhanced. As the FeCo-based alloy with bcc-structure, a $Co_XFe_{100-X}$ alloy (X=30 to 100) or a similar CoFe-based alloy containing an additive element can be exemplified. Among them, a $Fe_{40}CO_{60}$ alloy through a $Fe_{60}Co_{40}$ alloy may be employed in view of the above-described requirements.

In the case that the top pinned layer 143 is made of the magnetic layer with bcc-structure easily exhibiting the large MR ratio, the thickness of the top pinned layer 143 is preferably set to 1.5 nm or over so as to maintain the bcc-structure thereof stably. Since the spin valve film is made mainly of a metallic material with fcc-structure or fct-structure, only the top pinned layer 143 may have the bcc-structure. In this point of view, too thin top pinned layer 143 can not maintain the bcc-structure thereof stably so as not to obtain the large MR ratio.

Herein, the top pinned layer 143 is made of the $Fe_{50}Co_{50}$ layers and the extremely thin Cu layers. The total thickness of the $Fe_{50}Co_{50}$ layers is 3 nm and each Cu layer is formed on the corresponding $Fe_{50}Co_{50}$ layer with a thickness of 1 nm. The thickness of the Cu layer is 0.25 nm and the total thickness of the top pinned layer 143 is 3.5 nm.

It is desired that the thickness of the top pinned layer 143 is set to 5 nm or below so as to generate a large pinning (fixing) magnetic field. In view of the large pinning (fixing) magnetic field and the stability of the bcc-structure in the top pinned layer 143, the thickness of the top pinned layer 143 is preferably set within 2 to 4 nm.

The top pinned layer 143 may be made of a $Co_{90}Fe_{10}$ alloy with fcc-structure or a Co alloy with hcp-structure which used to be widely employed for a conventional magneto-resistance effect element, instead of the magnetic material with the bcc-structure. The top pinned layer 143 can be made of a single element such as Co, Fe, Ni or an alloy containing at least one of Co, Fe, Ni. In view of the large MR ratio of the top pinned layer 143, the FeCo alloy with the bcc-structure, the Co alloy containing Co element of 50% or over and the Ni alloy containing Ni element of 50% or over are in turn preferable.

In this embodiment, the top pinned layer 143 is made of the magnetic layers (FeCo layers) and the non magnetic layers (extremely thin Cu layers). In this case, the top pinned layer 143 can enhance the spin dependent scattering effect which is also called as a "spin dependent bulk scattering effect", originated from the extremely thin Cu layers.

The spin dependent bulk scattering effect is utilized in pairs for the spin dependent interface scattering effect. The spin dependent bulk scattering effect means the occurrence of an MR effect in a magnetic layer and the spin dependent interface scattering effect means the occurrence of an MR effect at an interface between a spacer layer and a magnetic layer.

Hereinafter, the enhancement of the bulk scattering effect of the stacking structure of the magnetic layer and the non magnetic layer will be described. With the CCP-CPP element, since a current is confined in the vicinity of the CCP-NOL layer 16, the resistance in the vicinity of the CCP-NOL layer 16 contributes the total resistance of the magneto-resistance effect element. Namely, the resistance at the interface between the CCP-NOL layer 16 and the magnetic layers (pinned layer 14 and the free layer 18) contributes largely to the magneto-resistance effect element. That means the contribution of the spin dependent interface scattering effect becomes large and important in the CCP-CPP element. The selection of magnetic material located at the interface for the CCP-NOL layer 16 is important in comparison with a conventional CPP element. In this point of view, the pinned layer 143 is made of the FeCo alloy with the bcc-structure exhibiting the large spin dependent interface scattering effect as described above.

However, it may be that the spin dependent bulk scattering effect should be considered so as to develop the MR ratio. In view of the development of the spin dependent bulk scattering effect, the thickness of the thin Cu layer is set preferably within 0.1 to 1 nm, more preferably within 0.2 to 0.5 nm. Too thin Cu layer can not develop the spin dependent bulk scattering effect sufficiently. Too thick Cu layer may reduce the spin dependent bulk scattering effect and weaken the magnetic coupling between the magnetic layers via the non magnetic Cu layer, which the magnetic layers sandwiches the non magnetic Cu layer, thereby deteriorating the property of the pinned layer 14. In a preferred embodiment, in this point of view, the thickness of the non-magnetic Cu layer is set to 0.25 nm. The non-magnetic layer sandwiched by the magnetic layers may be made of Hf, Zr, Ti instead of Cu. In the case that the pinned layer 14 contains the non-magnetic layer(s), the thickness of the one magnetic layer such as a FeCo layer which is separated by the non-magnetic layer is set preferably within 0.5 to 2 nm, more preferably within 1 to 1.5 nm.

In the above embodiment, the top pinned layer 143 is constituted of the alternately stacking structure of FeCo layer and Cu layer, but may be made of an alloyed layer of FeCo and Cu. The composition of the resultant FeCoCu alloy may be set to $((Fe_xCo_{100-x})_{100-y}Cu_y$: X=30 to 100% Cr, Y=3 to 15%), but set to another composition range. The third element to be added to the main composition of FeCo may be selected from Hf, Zr, Ti instead of Cu.

The top pinned layer 143 may be also made of a single element such as Co, Fe, Ni or an alloy thereof. In a simplified embodiment, the top pinned layer 143 may be made of an $Fe_{90}Co_{10}$ layer with a thickness of 2 to 4 nm, as occasion demands, containing a third additive element.

Then, the spacer layer will be concretely described. The bottom metallic layer 15 is employed for the formation of the current path 162 and thus, functions as a supplier for the current path 162. It is not required that the metallic layer 15 remains as it is apparently after the formation of the current path 162. In this point of view, the bottom metallic layer 15 functions broadly as a part of the spacer layer. The bottom metallic layer 15 functions as a stopper layer preventing the oxidization of the magnetic layer 143 which is located below the CCP-NOL layer 16 in the formation of the CCP-NOL layer 16.

The CCP-NOL layer 16 includes the insulating layer 161 and the current path 162. The insulating layer 161 is made of oxide, nitride, oxynitride or the like. For example, the insulating layer 161 may be made of an $Al_2O_3$ amorphous structure or an MgO crystalline structure. In order to exhibit the inherent function of the spacer layer, the thickness of the insulating layer 161 is set preferably within 1 to 3 nm, more preferably within 1.5 to 2.5 nm. The CCP-NOL layer 16 functions as a current confined layer.

The insulating layer 161 may be made of a typical insulating material such as $Al_2O_3$-based material, as occasion demands, containing a third additive element such as Ti, Hf, Mg, Zr, V, Mo, Si, Cr, Nb, Ta, W, B, C, V. The content of the additive element may be appropriately controlled within 0 to 50%. In a preferred embodiment, the insulating layer 161 is made of an $Al_2O_3$ layer with a thickness of about 2 nm.

The insulating layer 161 may be made of Ti oxide, Hf oxide, Mg oxide, Zr oxide, Cr oxide, Ta oxide, Nb oxide, Mo oxide, Si oxide or V oxide instead of the Al oxide such as the $Al_2O_3$. In the use of another oxide except the Al oxide, a third additive element such as Ti, Hf, Mg, Zr, V, Mo, Si, Cr, Nb, Ta, W, B, C, V may be added to the oxide as occasion demands. The content of the additive element may be appropriately controlled within 0 to 50%.

The insulating layer 161 may be also made of a nitride or an oxynitride containing, as a base material, Al, Si, Hf, Ti, Mg, Zr, V, Mo, Nb, Ta, W, B, C only if the insulating layer 161 can exhibit the inherent insulating function.

The current path 162 functions as a path to flow a current in the direction perpendicular to the film surface of the CCP-NOL layer 16 and then, confining the current. The current path 162 also functions as a conductor to flow the current in the direction perpendicular to the film surface of the insulating layer 161 and is made of a metal such as Cu. In other words, the spacer layer 16 exhibits the current-confined path structure (CCP structure) so as to enhance the MR ratio from the current confining effect.

The current path 162 (CCP) may be made of Au, Ag, Ni, Co, Fe or an alloy containing at least one from the listed elements instead of Cu. In a preferred embodiment, the current path 162 is made of a Cu alloy. The current path 162 may be made of an alloy layer of CuNi, CuCo or CuFe. Herein, the content of Cu in the alloy is set preferably to 50% or over in view of the enhancement of the MR ratio and the reduction of the interlayer coupling field, Hin between the pinned layer 14 and the free layer 18.

The content in oxygen and nitrogen of the current path 162 is much smaller than (at least half as large as) the one of the insulating layer 161. The current path 162 is generally crystallized. Since the resistance of the crystalline phase is smaller than the resistance of the non-crystalline phase, the current path 162 can easily conduct the inherent function.

The top metallic layer 17 functions as a barrier layer protecting the oxidization of the free layer 18 to be formed thereon through the contact with the oxide of the CCP-NOL layer 16 so that the crystal quality of the free layer 18 cannot be deteriorated. For example, when the insulating layer 161 is made of an amorphous material (e.g., $Al_2O_3$), the crystal quality of a metallic layer to be formed on the layer 161 may be deteriorated, but when a layer (e.g., Cu layer) to develop the crystal quality of fcc-structure is provided (under the condition that the thickness of the metallic layer is set to 1 nm or below), the crystal quality of the free layer 18 can be remarkably improved.

It is not always required to provide the top metallic layer 17 dependent on the kind of material in the CCP-NOL layer 16 and/or the free layer 18. Moreover, if the annealing condition is optimized and the appropriate selection of the materials of the insulating layer 161 of the thin oxide layer 16 and the free layer 18 is performed, the deterioration of the crystal quality of the free layer 18 can be prevented, thereby omitting the metallic layer 17 of the CCP-NOL layer 16.

In view of the manufacturing yield of the magneto-resistance effect element, it is desired to form the top metallic layer 17 on the CCP-NOL layer 16. In a preferred embodiment, the top metallic layer 17 can be made of a Cu layer with a thickness of 0.5 nm.

The top metallic layer 17 may be made of Au or Ag instead of Cu. Moreover, it is desired that the top metallic layer 17 is made of the same material as the material of the current path 162 of the CCP-NOL layer 16. If the top metallic layer 17 is made of a material different from the material of the current path 162, the interface resistance between the layer 17 and the path 162 is increased, but if the top metallic layer 17 is made of the same material as the material of the current path 162, the interface resistance between the layer 17 and the path 162 is not increased.

The thickness of the top metallic layer 17 is set preferably within 0 to 1 nm, more preferably within 0.1 to 0.5 nm. Too thick top metallic layer 17 may extend the current confined through the spacer layer 16 there at, resulting in the decrease of the MR ratio due to the insufficient current confinement.

The essential point in this embodiment is directed at the remarkable improvement in reliability of the element by forming an adhesive enhancing portion in at least a portion of the spacer layer. Details for the adhesive enhancing portion will be described hereinafter.

The free layer 18 is a ferromagnetic layer of which the direction of magnetization is varied commensurate with the external magnetic field. For example, the free layer 18 is made of a double-layered structure of $Co_{90}Fe_{10}$ 1 nm/$Ni_{83}Fe_{17}$ 3.5 nm. In this case, the $Co_{90}Fe_{10}$ layer is formed at the interface between the free layer 18 and the spacer layer 16, which is desirable in the case that the $Ni_{83}Fe_{17}$ layer is formed at the interface therebetween. In order to realize the large MR ratio, the selection of magnetic material of the free layer 18 in the vicinity of the spacer 16, that is, at the interface therebetween is important. The free layer 18 may be made of a single $Co_{90}Fe_{10}$ layer with a thickness of 4 nm without a NiFe layer or a triple-layered structure of CoFe/NiFe/CoFe.

Among CoFe alloys, the $Co_{90}Fe_{10}$ layer is preferably employed in view of the stable soft magnetic property. If a CoFe alloy similar to the $Co_{90}Fe_{10}$ alloy in composition is employed, it is desired that the thickness of the resultant CoFe alloy layer is set within 0.5 to 4 nm. Moreover, the free layer 18 may be made of $Co_XFe_{100-X}$ (X=70 to 90%).

Then, the free layer 18 is made of an alternately stacking structure of CoFe layers or Fe layers with a thickness of 1 to 2 nm and extremely thin Cu layers with a thickness of 0.1 to 0.8 nm.

In the case that the CCP-NOL layer 16 is made of the Cu layer, it is desired that the FeCo layer with bcc-structure is employed as the interface material thereof for the spacer layer 16 so as to enhance the MR ratio in the same manner as the pinned layer 14. As the FeCo layer with bcc-structure, the $Fe_XCo_{100-X}$ (X=30 to 100) or, as occasion demands, containing a third additive element, may be employed. In a preferred embodiment, a $Co_{90}Fe_{10}$ 1 nm/$Ni_{83}Fe_{17}$ 3.5 nm may be employed. Instead of the FeCo layer with bcc-structure, a CoFe layer with fcc-structure may be employed.

The cap layer 19 functions as protecting the spin valve film. The cap layer 19 may be made of a plurality of metallic layers, e.g., a double-layered structure of Cu 1 nm/Ru 10 nm. The layered turn of the Cu layer and the Ru layer may be switched so that the Ru layer is located in the side of the free layer 18. In this case, the thickness of the Ru layer is set within 0.5 to 2 nm. The exemplified structure is particularly desired for the free layer 19 of NiFe because the magnetostriction of the interface mixing layer formed between the free layer 18 and the cap layer 19 can be lowered due to the non-solution between Ru and Ni.

When the cap layer 19 is made of the Cu/Ru structure or the Ru/Cu structure, the thickness of the Cu layer is set within 0.5 to 10 nm and the thickness of the Ru layer is set smaller, e.g., within 0.5 to 5 nm due to the large specific resistance.

The cap layer 19 may be made of another metallic layer instead of the Cu layer and/or the Ru layer. The structure of the cap layer 19 is not limited only if the cap layer 19 can protect the spin valve film. If the protective function of the cap layer 19 can be exhibited, the cap layer 19 may be made of still another metal. Attention should be paid to the metallic layer because the kind of material of the cap layer may change the MR ratio and the long reliability. In view of the stable MR ratio and long reliability, the Cu layer and/or the Ru layer is preferable for the cap layer.

The top electrode 20 functions as flowing a current through the spin valve film in the direction perpendicular to the film surface of the spin valve film. The intended current can be flowed through the spin valve film in the direction perpendicular to the film surface by applying a voltage between the top electrode 20 and the bottom electrode 11. The top electrode 20 may be made of a material with smaller resistance (e.g., Cu or Au).

Figure 2:
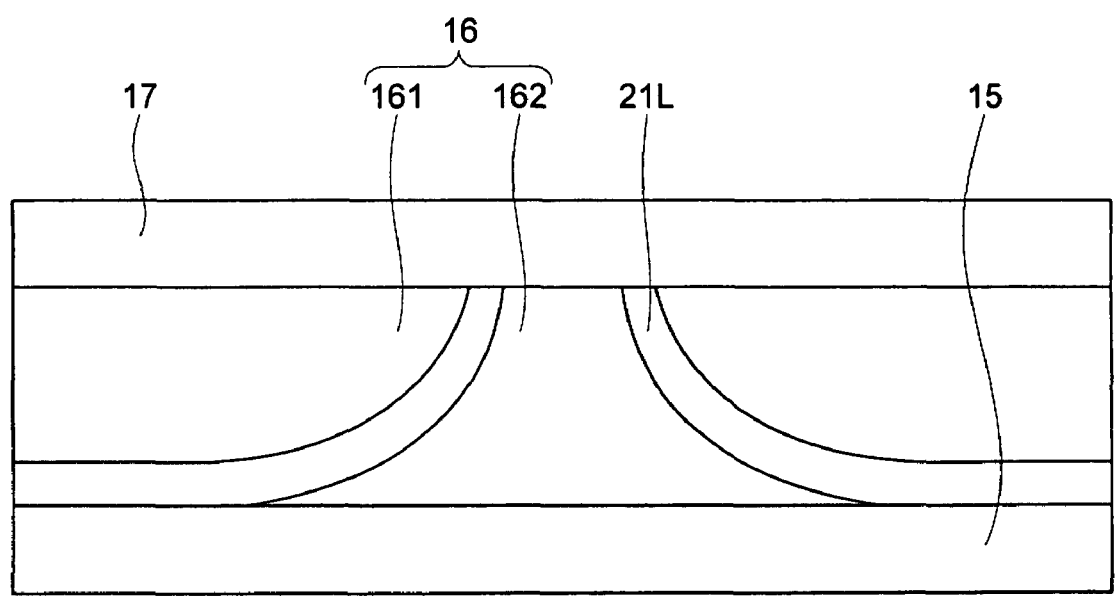
FIG. 2 is a schematic view illustrating the area in the vicinity of the spacer layer of the magneto-resistance effect element in FIG. 1.
Figure 3:
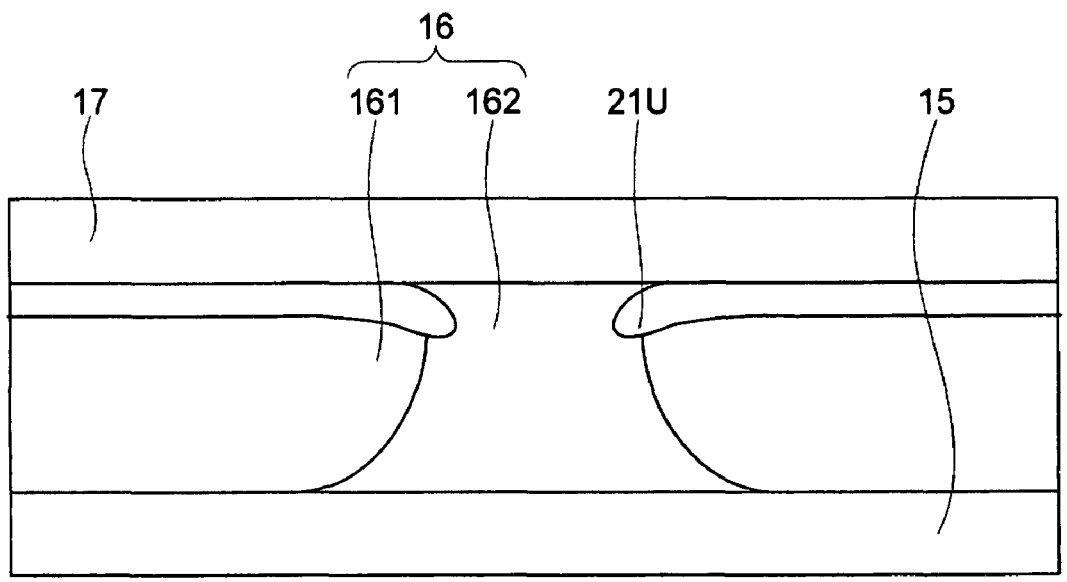
FIG. 3 is another schematic view illustrating the area in the vicinity of the spacer layer of the magneto-resistance effect element in FIG. 1.
Figure 4:
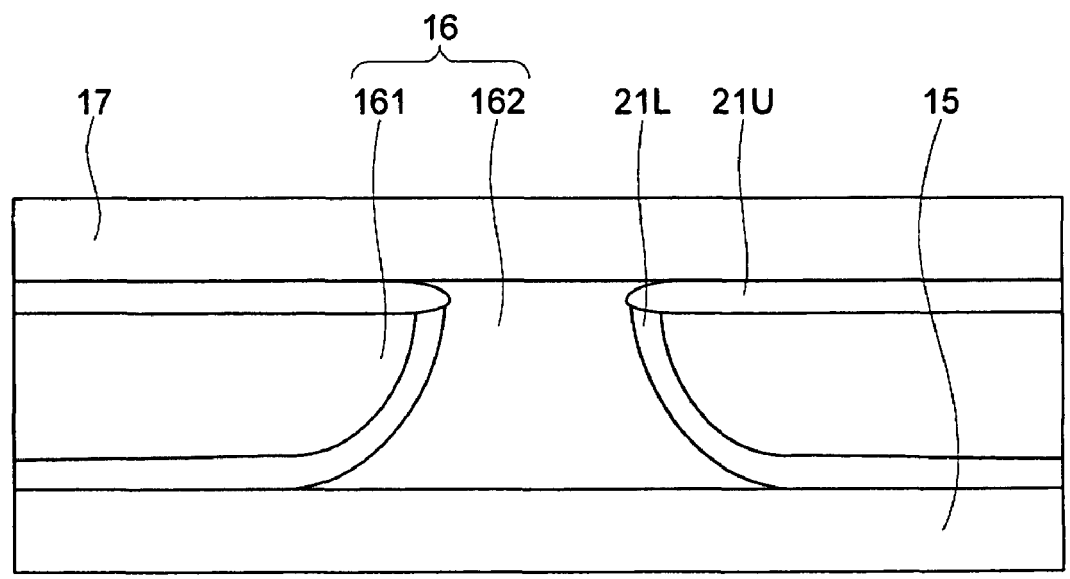
FIG. 4 is still another schematic view illustrating the area in the vicinity of the spacer layer of the magneto-resistance effect element in FIG. 1.

FIGS. 2 to 4 are enlarged schematic views, each illustrating the area in the vicinity of the spacer layer of the magneto-resistance effect element in this embodiment. FIG. 2 relates to an embodiment where the adhesion enhancing layer 21L is formed at the interface between the bottom surface of the insulating layer 161 and bottom metallic layer 15 and at the interface between insulating layer 161 and the current path 162. FIG. 3 relates to an embodiment where the adhesion enhancing layer 21U is formed at the interface between the top surface of the insulating layer 161 and the top metallic layer 17. FIG. 4 relates to an embodiment where the adhesion enhancing layer 21L is formed at the interface between the bottom surface of the insulating layer 161 and bottom metallic layer 15 and at the interface between insulating layer 161 and the current path 162 and the adhesion enhancing layer 21U is formed at the interface between the top surface of the insulating layer 161 and the top metallic layer 17.

In the magneto-resistance effect element of this embodiment, since the adhesion enhancing layer(s) is (are) provided adjacent to the insulating layer 161, the adhesion between the insulating layer 161 and the current path 162, the bottom metallic layer 15, the adhesion between the insulating layer 161 and the top metallic layer 17 or the adhesion between the insulating layer 161 and the current path 162, the bottom metallic layer 15 and the top metallic layer 17 can be enhanced. In this case, the adhesion between the interfaces of the layers as described above can be enhanced so that the characteristics and reliability of the magneto-resistance effect element can be enhanced. As a result, the advanced in reliability CCP-CPP type magneto-resistance effect element can be provided.

As described above, since the insulating layer 161 mainly contains Al, Si, Hf, Ti, V, Ta, W, Mg, Cr or Zr, the adhesion enhancing layer 21L may be also made of Al, Si, Hf, Ti, V, Ta, W, Mg, Cr or Zr. Otherwise, the adhesion enhancing layer 21L may contain an element with an oxide formation energy higher than the oxide formation energy of the element composing the insulating layer 161 and lower than the oxide formation energies of the elements composing the metallic layers 15, 17 and the current path 162.

Table 1 lists the oxide formation energies of the corresponding elements as described above. Referring to Table 1, when the insulating layer 161 contains Al, the adhesion enhancing layer 21L may contain Si, Hf, Ti, V, W, Mg, Mo, Cr or Zr. When the insulating layer 161 contains Si, the adhesion enhancing layer 21L may contain Mo, V, W, Mg.

Herein, in the case that the matrix layer of the adhesion enhancing layer is formed after the CCP-NOL layer 16 is formed, and the adhesion enhancing layer is formed at the interface between the insulating layer 161 and the metallic layer 17 from the matrix layer, for example, the adhesion enhancing layer may contain the same element as the element composing the insulating layer 161. The reason is that the oxygen of the insulating layer becomes energetically stable so that the amount of oxygen to be contacted with the metallic layer 17 can be lowered because the CCP-NOL layer is formed in advance.

TABLE 1

| | Element | Oxide | Oxide formation energy $\{\times 10^{-6}$ J/kmol$\}$ |
|---|---|---|---|
| Main element composing metallic layer15, current confining path 162, and metallic layer17 | Au | $Au_2O_3$ | 163 |
| | Ag | $Ag_2O$ | −11 |
| | Cu | CuO | −127 |
| Main element composing pinned layer14 and free layer18 | Co | CoO | −213 |
| | Ni | NiO | −216 |
| | Fe | FeO | −244 |
| Main element to be incorporated in insulating layer161, and adhesion enhancing layers 21U and 21L | Mo | $MoO_2$ | −502 |
| | Mg | MgO | −573 |
| | V | $VO_2$ | −680 |
| | W | $WO_3$ | −763 |
| | Si | $SiO_2$ | −805 |
| | Ti | $TiO_2$ | −880 |

TABLE 1-continued

| Element | Oxide | Oxide formation energy {× 10⁻⁶ J/kmol} |
|---|---|---|
| Zr | TrO₂ | 1037 |
| Cr | Cr₂O₃ | −1048 |
| Hf | HfO₂ | −1084 |
| Al | Al₂O₃ | −1580 |
| Ta | Ta₂O₅ | −1970 |

It is desired that the thickness of the adhesion enhancing layer is set larger in view of the enhancement of adhesion thereof. However, if the adhesion enhancing layer is formed too thick, the current confined through the CCP-NOL layer may extend at the pinned layer 14 and the free layer 18, thereby reducing the enhancement effect of the spin dependent interface scattering because the distance between the CCP-NOL layer 16 and the pinned layer 14 and/or the distance between the CCP-NOL layer 16 and the free layer 18 is elongated. Therefore, the thickness of the adhesion enhancing layer is set preferably within 0.05 to 1 nm, more preferably within 0.1 to 0.5 nm.

The structure of the CCP-NOL layer 16 containing the adhesion enhancing layer can be observed by means of the Local Electrode Atom Probe made by "Imago Scientific Instruments Inc".

According to the three-dimensional atom probe, the composition of the material to be observed can be mapped three-dimensionally in the order of atomic level. Concretely, the sample to be measured is processed in needle shape so that the curvature radius of the forefront of the sample is set within 30 to 100 nm and the length (height) of the sample is set to about 100 µm. Then, a high voltage is applied to the sample so as to evaporate the atoms from the forefront of the sample by means of the electric field generated by the application of the high pulsed voltage, which the evaporated atoms are detected by the two-dimensional detector. The intended three-dimensional (x, y, z) structure can be obtained from the information in the depth (z-axis) direction by following the changes in position information of the atoms in the two dimensional (x, y) plane with time, which the position information of the atoms are detected by the two-dimensional detector.

A three-dimensional atom probe made by "Oxford Instruments Inc." or Cameca Inc. may be employed instead of the three-dimensional atomic force microprobe.

The electric field evaporation may be conducted by the application of a laser pulse instead of the pulsed voltage. In both cases, a biasing electric field is applied by means of DC voltage. With the pulsed voltage, the electric field requiring the electric field evaporation can be generated in dependent on the amplitude of the voltage with the laser pulse, the sample is locally heated by the irradiation of the laser pulse so that the electric field evaporation can be likely to be generated.

The reason the structure of the CCP-NOL layer 16 can exhibit the high reliability will be described hereinafter.

A. Oxidization of Metal Adjacent to Insulating Layer 161 of CCP-NOL Layer 16

In the case that the insulating layer 161 of the CCP-NOL layer 16 is made of Al₂O₃ and the metallic layers 15, 17 are made of Cu, the areas of the metallic layers 15, 17 contacting with the insulating layer 161 are oxidized to form CuOx compounds. It is known that the CuOx compound lowers the adhesion for the adjacent layer. In this way, an oxide of Cu, Au or Ag with a larger oxide formation energy is likely to lower the adhesion for the adjacent layer.

In the CCP-CPP element, when the adhesion of the metallic layer adjacent to the insulating layer 161 is lowered, the microscopic disorder of atom and the small film peeling may occur by the driving force originated from the heat generation from the current flow. When a current is flowed in the CCP-CPP element, the current is concentrated in the vicinity of the metallic path. Therefore, since the current density around the metallic path is increased so as to generate the Joule heat, the area around the metallic path is locally heated. Then, the conduction electrons attack the insulating layer in the vicinity of the current path, and thus, damage the insulating layer. In this way, the CCP-NOL layer 16 is disposed under the severe condition due to the current concentration, which is different from a TMR (Tunneling Magneto Resistance) film.

When the magneto-resistance effect element is observed by means of cross section TEM after the operation of current flowing, the interface between the insulating layer and the adjacent metallic layer is not broken, so it is considered that the microscopic disorder of atom affects the spin dependent conduction.

In this way, when the adhesion of the metallic layer adjacent to the CCP-NOL layer 16 is lowered, the microscopic disorder of atom and the small film peeling may occur, thereby deteriorating the reliability of the intended magneto-resistance effect element. By providing the adhesion enhancing layer 21L as shown in FIGS. 2 and 4, however, the microscopic disorder of atom and the small film peeling can be prevented, thereby enhancing the reliability of the CCP-NOL layer 16 and the reliability of the CCP-CPP type magneto-resistance effect element containing the CCP-NOL layer. The principle relating the reliability enhancement will be described hereinafter.

B. Enhancement of Magneto-Resistance Effect Element Using Adhesion Enhancing Layer The affection of the adhesion enhancing layer to the magneto-resistance effect element will be described referring to the embodiment relating to FIG. 2 where the adhesion enhancing layer 21L is formed between the metallic layer 15, the current path 162 and the insulating layer 161.

In the case that the adhesion enhancing layer is not provided, since the insulating layer 161 containing much amount of oxygen is directly contacted with the metallic layer 15 and the current path 162, the metallic portions of the metallic layer 15 and the current path 162 may be oxidized.

In contrast, in the case that the adhesion enhancing layer is provided as shown in FIG. 2, the adhesion enhancing layer 21L is configured to contain a kind of element with an oxide formation energy lower than the oxide formation energies of the elements composing the metallic layer 15 and the current path 162 and higher than the oxide formation energy of the main element composing the insulating layer 161. Referring to the oxygen distribution relating to the insulating layer 161 and the adhesion enhancing layer 21L, since the oxide formation energy of the insulating layer 161 is lower than the one of the adhesion enhancing layer 21L so that the insulating layer 161 is likely to be oxidized in comparison with the adhesion enhancing layer 21L, the insulating layer 161 contains much amount of oxygen. As a result, since the metallic layer 15 and the current path 162 are contacted with the adhesion enhancing layer 21L containing less amount of oxygen, the oxidization of the metallic layer 15 and the current path 162 can be prevented.

The principle of the adhesion enhancement was not only described referring to the embodiment where the adhesion enhancing layer 21L is formed between the metallic layer 15, the current path 162 and the insulating layer 161, but can be also described referring to another embodiment where the adhesion enhancing layer 21U is provided between the insulating layer 161 and the top metallic layer 17. In this way, the reliability of the CCP-NOL layer 16 can be enhanced, and thus, the reliability of the magneto-resistance effect element can be also enhanced.

(Method for Manufacturing a Magneto-Resistance Effect Element)

Figure 5:
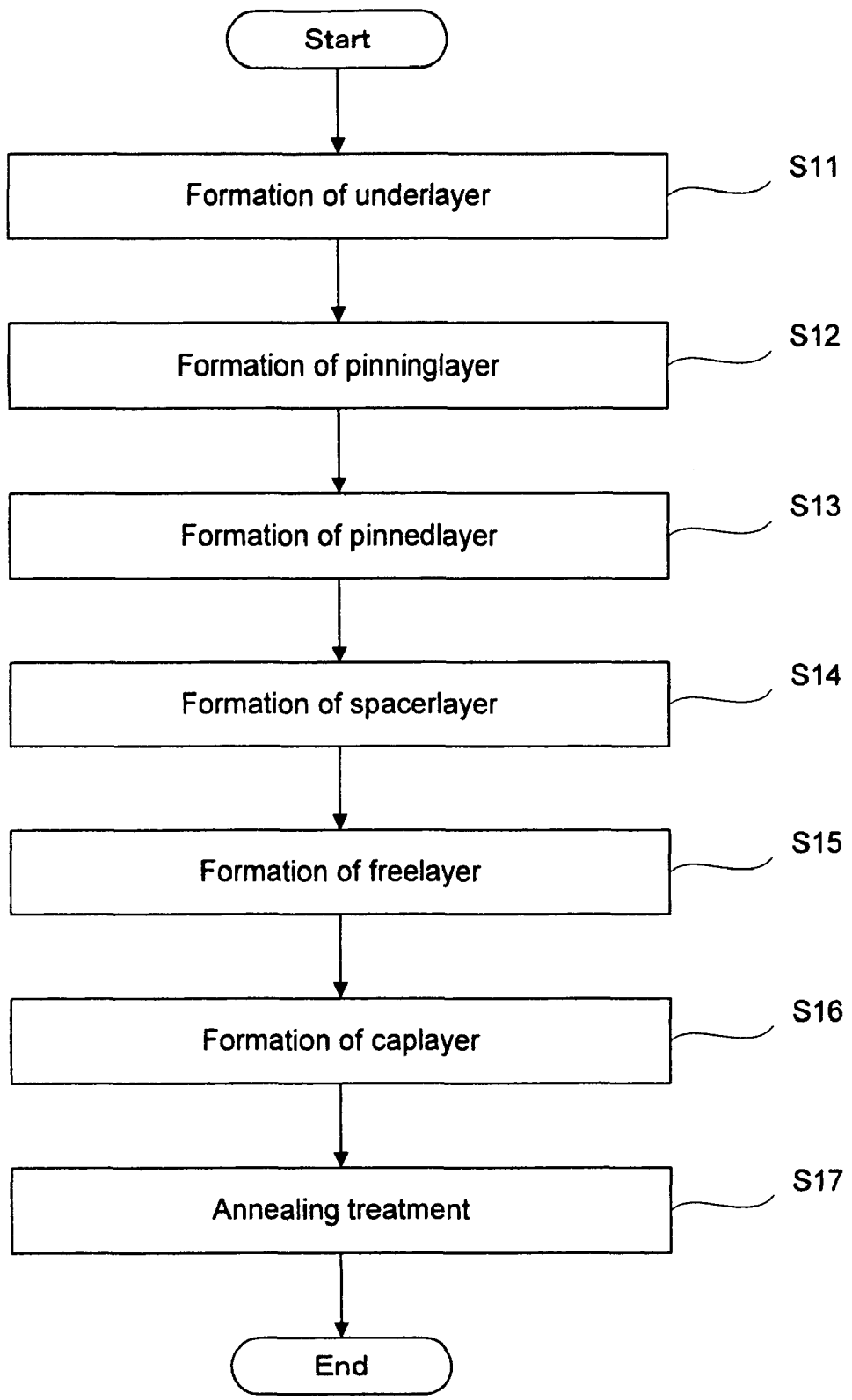
FIG. 5 is a flowchart in a method for a magneto-resistance effect element according to the present invention.

Then, the method for manufacturing the magneto-resistance effect element will be described. FIG. 5 is a flow chart in a method for a magneto-resistance effect element according to the first embodiment.

As shown in FIG. 5, the underlayer 12 through the cap layer 19 are subsequently formed schematically in accordance with the material compositions and the sizes (thickenesses) as described above Steps S11-S17). In this case, when the spacer layer composed of the metallic layer 15, the CCP-NOL layer 16 and the metallic layer 17 is formed in Step S14, the adhesion enhancing layer 21L is formed at the interface between the insulating layer 161 and the metallic layer 15, the current path 162, the metallic layer 17.

Hereinafter, the detail steps in Step S14 for the formation of the adhesion enhancing layer will be described. In this embodiment, suppose that the insulating layer 161 is made of an amorphous $Al_2O_3$ and the current path 162 is made of a crystalline Cu.

Figure 6:
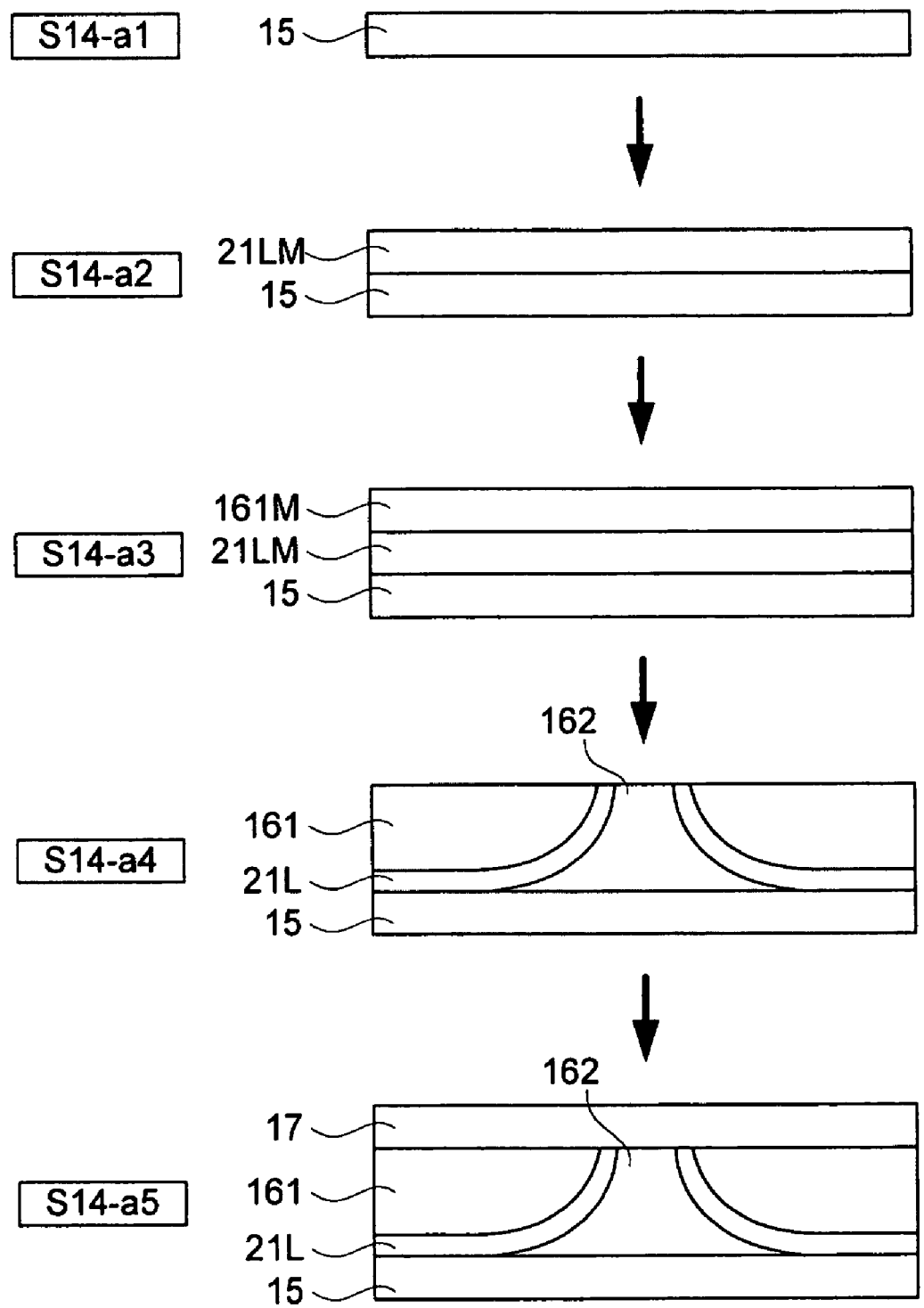
FIG. 6 is views relating to the formation process of a spacer layer containing an adhesion developing layer.

FIG. 6 relates to the detail steps for the formation of the adhesion enhancing layer 21L as shown in FIG. 2.

First of all, the bottom metallic layer 15 is formed of Cu (S14-a1). Then, the metallic layer 21LM composing the matrix of the adhesion enhancing layer is formed (S14-a2). The metallic layer 21LM may be made of a material (element) with an oxide formation energy higher than the oxide formation energy of the element mainly composing the CCP-NOL layer and lower than the oxide formation energy of the element composing the metallic layer 15. In this embodiment, since the insulating layer 161 is made of $Al_2O_3$, the adhesion enhancing layer 21L (metallic layer 21LM) may be made of Si, Hf, Ti, V, W, Mg, Mo, Cr or Zr referring to Table 1.

Then, the layer 161M composing the matrix of the CCP-NOL layer is formed (S14-a3). In this embodiment, since the insulating layer 161 is made of $Al_2O_3$, the matrix layer 161M is made of AlCu or Al.

Then, the insulating layer 161 and the current path 162 are formed in accordance with a prescribed process. Various processes for the formation of the insulating layer 161 and the current path 162 can be exemplified as described below.

First of all, ion beams of inert gas such as Ar are irradiated onto the matrix metallic layer 161M. The irradiation of ion beams corresponds to a pre-treatment for the formation the insulating layer 161 and the current path 162 and is called as a "PIT (Pre-ion treatment)". The portion of the bottom metallic layer is pumped up and infiltrated into the matrix metallic layer 161M. In this way, such an energetic treatment as the PIT for the matrix metallic layer 161M is important.

The metallic layer 15 of Cu and the matrix layer 21LM of the adhesion enhancing layer are formed two-dimensionally, but the Cu element of the metallic layer 15 and the matrix element of the matrix layer 21LM are pumped up and infiltrated into the matrix metallic layer 161M of AlCu through the PIT process. The Cu element infiltrated into the matrix metallic layer 161M remains the same after post-oxidization, thereby forming the current path 162. The matrix element 21LM infiltrated into the matrix metallic layer 161M is segregated from the Cu element after the post-oxidization but not segregated at the PIT process. The PIT process is important for the formation of the current path made of high purity Cu.

In the PIT process, for example, the Ar ion beams are irradiated under the condition that the accelerating voltage is set within 30 to 150 V, the beam current is set within 20 to 200 mA and the treatment period of time is set within 30 to 180 seconds. The accelerating voltage is preferably set within 40 to 60 V. If the accelerating voltage is set beyond the above-described range, the PIT process may induce the surface roughness for the assembly under fabrication, thereby deteriorating the MR ratio. The beam current is preferably set within 30 to 80 mA and the treatment period of time is preferably set within 60 to 150 seconds.

The adhesion enhancing layer 21L and the current path 162 may be formed by means of biasing sputtering for the matrix metallic layer 161M before the conversion to the insulating layer 161 instead of the PIT process. With the DC biasing, the energy of the biasing sputtering is configured such that the DC biasing voltage is set within 30 to 200 V. With the RF biasing, the energy of the biasing sputtering is configured such that the RF biasing power is set within 30 to 200 W.

Then, an oxidizing gas is supplied so as to oxidize the matrix metallic layer 161M, thereby forming the insulating layer 161. In this case, the oxidizing condition is appropriately controlled so as not to oxidize the current path 162. According to the oxidizing process, the matrix metallic layer 161M is converted into the insulating layer 161 of $Al_2O_3$ and the current path 162 is formed through the insulating layer 161, thereby forming the CCP-NOL layer 16. In the oxidizing process, the matrix material 21LM to compose the adhesion enhancing layer is pumped up with the Cu element of the current path, and then, concentrated at the interface between the insulating layer 161 of $Al_2O_3$ and the current path 162 of Cu, thereby forming the adhesion enhancing layer 21L. The matrix material 21LM located below the insulating layer 161 constitutes the adhesion enhancing layer 21L as it is.

The oxidizing process can be conducted by supplying the oxidizing gas under the condition that ion beams of inert gas (Ar, Xe, Kr, He) are irradiated onto the matrix metallic layer 161M (Ion beam-assisted Oxidation: IAO). The spacer layer 16 containing the insulating layer 161 of $Al_2O_3$ and the current path 162 of Cu is formed through the oxidizing process. The oxidizing process utilizes the characteristics of Al and Cu for oxidization. Generally, Al is likely to be oxidized and Cu is not likely to be oxidized.

In the oxidizing process, for example, the Ar ion beams are irradiated under the condition that the accelerating voltage is set within 40 to 200 V, the beam current is set within 30 to 200 mA and the treatment period of time is set within 15 to 300 seconds while the oxygen gas is supplied. The accelerating voltage is preferably set within 50 to 100 V. If the accelerating voltage is set beyond the above-described range, the PIT process may induce the surface roughness for the assembly under fabrication, thereby deteriorating the MR ratio. The beam current is preferably set within 40 to 100 mA and the treatment period of time is preferably set within 30 to 180 seconds.

In the oxidizing process using the IAO, the amount of oxygen is set preferably within 2000 to 4000 L (Langmuir) because it is not desired that the bottom magnetic layer (pinned layer 14) is oxidized in addition to the elemental Al of the matrix metallic layer 161M, which leads to the deterioration of the thermal robustness and reliability of the CCP-CPP element. In view of the enhancement of the reliability of the CCP-CPP element, it is important that the magnetic layer (pinned layer 14) under the spacer layer 16 is not oxidized so as to maintain the metallic property thereof. In this point of view, the amount of oxygen to be supplied is preferably set within the above-described range.

In order to form the stable oxide by supplying the oxygen, it is desired that the oxygen is supplied only while the ion beams are irradiated onto the assembly under fabrication. In other words, it is desired that the oxygen is not supplied while the ion beams are not irradiated.

The thickness of the bottom metallic layer 15 of Cu is controlled in accordance with the thickness of the matrix metallic layer 161M of AlCu. Namely, if the thickness of the matrix metallic layer 161M is increased, the thickness of the bottom metallic layer 15 is required to be increased so as to infiltrate much amount of elemental Cu composing the bottom metallic layer 15 into the matrix metallic layer 161M in the PIT process. For example, when the thickness of the matrix metallic layer 161M is set within 0.6 to 0.8 nm, the thickness of the bottom metallic layer 15 is set within 0.1 to 0.5 nm. When the thickness of the matrix metallic layer 161M is set within 0.8 to 1 nm, the thickness of the bottom metallic layer 15 is set within 0.3 to 1 nm. If the bottom metallic layer 15 is formed too thin, the sufficient amount of elemental Cu can not be supplied into the matrix metallic layer 161M in the PIT process, so that it is difficult to form the current path 162 through the matrix metallic layer 161M. As a result, the area resistance RA of the resultant magneto-resistance effect element may be much increased and the MR ratio may be deteriorated.

In contrast, If the bottom metallic layer 15 is formed too thick, the sufficient amount of elemental Cu can be supplied into the matrix metallic layer 161M in the PIT process, but the thick remnant Cu layer may be formed from the bottom metallic layer between the pinned layer 14 and the spacer layer 16. In order to realize the high MR ratio in the CPP-CPP element, it is required that the current confined through the spacer layer 16 is flowed to the magnetic layer (the pinned layer 14 or the free layer 18) as it is. If the thick Cu layer remains between the pinned layer 14 and the spacer layer 16, the current confined through the spacer layer 16 is extended in the vicinity of the pinned layer 14, resulting in the deterioration of the MR ratio. In this point of view, it is desired that the thickness of the remnant Cu layer is set to 1 nm or below after the completion of the intended magneto-resistance effect element. If the thickness of the Cu layer is set beyond the above-described range, the current confinement effect is diminished and thus, the MR ratio may not be enhanced. Preferably, the thickness of the Cu layer is set to 0.6 nm or below.

The current path 162 may be made of another material such as Au or Ag instead of Cu. However, it is desired that the current path 162 is made of Cu because the Cu current path 162 can exhibit a larger thermal stability against a given thermal treatment in comparison with an Au or Ag current path.

If the current path 162 is made of the same magnetic material as the pinned layer 14, the metallic supplier (first metallic layer) for the current path 162 is not required to be formed on the pinned layer 14. Namely, a second metallic layer to be converted into the insulating layer 161 is formed on the pinned layer 14, and the element composing the pinned layer 14 is infiltrated into the second metallic layer through the PIT process, thereby forming the current path 162 made of the magnetic material of the pinned layer 14.

If the matrix layer 162M is made of $Al_{90}Cu_{10}$, the elemental Cu of the matrix layer 162M is segregated from the elemental Al thereof and the elemental Cu is pumped up from the first metallic layer in the PIT process. Namely, the current path 162 is formed by the first and second metallic layers. If the ion beam-assisted oxidation is carried out after the PIT process, the separation between the elemental Al and the elemental Cu is developed and then, the oxidation for the elemental Al is developed.

When the matrix layer 162M is made of AlCu, the thickness of the matrix layer 162M is set within 0.6 to 2 nm. When the matrix layer 162M is made of Al, the thickness of the matrix layer 162M is set within 0.5 to 1.7 nm. The thickness of the insulating layer 161 converted through oxidation from the second metallic layer formed from the matrix layer 162M is set within 0.8 to 3.5 nm. Particularly, the insulating layer 161 with a thickness of 1.3 to 2.5 nm can be easily formed and thus, exhibit some advantages for the current confinement effect. The diameter of the current path 162 through the insulating layer 161 is within a range of 1 to 10 nm, preferably within a range of 2 to 6 nm. If the diameter of the current path 162 is beyond 10 nm, the characteristics of the intended magneto-resistance effect element may fluctuated due to the large size of the current path 162 as the magneto-resistance effect element is downsized. In this point of view, it is desired that the current path 162 with a diameter of 6 nm or over is not formed.

In this embodiment, in order to realize the current path 162 under good condition, the formation process of the current path 162 using the PIT/IAO treatment was described. However, the current path 162 can be formed under good condition by means of ion beam treatment using ion beams of inert gas such as Ar, Xe, Kr or plasma treatment using inert gas plasma instead of the PIT process after the IAO process. The formation process is called as an "AIT (After-ion treatment)" because the ion beam treatment or the plasma treatment is carried out after the oxidation. In other words, the current path 162 can be formed by means of the IAO/AIT treatment.

With the PIT treatment, the elemental Cu is segregated from the elemental Al before oxidation. With the AIT treatment, the elemental Al is oxidized into $Al_2O_3$ by means of the IAO, and then, the elemental Cu is segregated from the $Al_2O_3$. The segregation is enhanced by the energy application from the ion beam irradiation or the plasma irradiation.

Moreover, by AIT process, if the current path 162 is partially oxidized, the oxidized portion of the current path 162 can be reduced. For example, in the case that the current path 162 is made of Cu, if the current path 162 is partially oxidized to be converted into a CuOx compound through the IAO treatment, the CuOx compound is reduced by means of the AIT treatment to be converted into the corresponding metallic Cu.

In the AIT treatment, the ion beams of inert gas such as Ar, Kr, He, Ne, Xe are irradiated onto the second metallic layer under the condition that the accelerating voltage is set within 50 to 200 V, the current is set within 30 to 300 mA and the treatment period of time is set within 30 to 180 seconds. Or the plasma (e.g., RF plasma) of inert gas is contacted with the second metallic layer.

With the AIT treatment using the ion beams, the accelerating voltage and the current can be controlled independently. With the AIT treatment using the plasma, the accelerating voltage and the current are determined simultaneously from the RF input power and thus, can not be almost controlled independently. With the AIT treatment using the plasma, however, the maintenance of the apparatus to be employed for the AIT treatment can be simplified. In the AIT treatment, therefore, the ion beams or the plasma can be appropriately selected in view of the above-described advantages and disadvantages.

The AIT treatment requires an energy treatment larger than the PIT treatment after oxidation, so that the interlayer coupling field between the pinned layer 14 and the free layer 18 is likely to be large because the surface roughness of the insulating layer 161 of the spacer layer 16 becomes conspicuous by the AIT treatment to increase the Neel coupling (Orange peel coupling). With the PIT treatment, such a problem as described above can be prevented. In this point of view, the PIT treatment is preferable.

The AIT treatment can be combined with the PIT treatment. In this case, three treatments of PIT/IAO/AIT may be conducted.

In this case, it is desired that the AIT treatment is conducted using a lower energy in comparison with the AIT treatment in the oxidizing treatment such as the PIT/IAO treatment without the PIT treatment so as to remove small amount of floating oxygen absorbed in the second metallic layer after the IAO treatment. The AIT treatment in the PIT/IAO/AIT treatment can be conducted under the condition that the accelerating voltage is set within 50 to 100 V, the current is set within 30 to 20 mA and the treatment period of time is set within 10 to 120 seconds while the ion beams of inert gas such as Ar, Kr, He, Ne, Xe are irradiated or the plasma (RF plasma) of inert gas is contacted.

Then, the top metallic layer 17 is formed, e.g., as a Cu layer with a thickness of 0.25 nm on the CCP-NOL layer 16 (S4-$a$5). Preferably, the thickness of the top metallic layer 17 is set within 0.2 to 0.6 nm. If the thickness of the top metallic layer 17 is set to about 0.4 nm, the crystallinity of the free layer 18 can be easily enhanced. Since the crystallinity of the free layer 18 can be controlled by adjusting the film-forming condition, the top metallic layer 17 may be omitted as occasion demands.

The adhesion enhancement can be conducted by another means using plasma or ion beam as an adhesion enhancing treatment instead of the formation of the adhesion enhancing layer. For example, the plasma treatment or the ion beam treatment is conducted so as to develop the roughness at the interface between the adjacent layers and thus, increase the contacting area between the adjacent layers. In this case, the adhesion between the adjacent layers can be enhanced by the increase of the contacting area. Moreover, the intermixing between the adjacent layers can be conducted by the plasma treatment or the ion beam treatment so as to much enhance the adhesion between the adjacent layers.

Concretely, the plasma treatment is conducted by contacting a plasma of inert gas with the interface between the adjacent layers before the upper layer is formed. The ion beam treatment is conducted by irradiating ion beams of inert gas onto the interface between the adjacent layers before the upper layer is formed. As the inert gas, Ar, Xe, Kr, He, Ne can be exemplified. In view of the manufacturing cost, Ar is preferable as the inert gas. Of course, Xe with larger mass than Ar may be employed as occasion demands. The use of Xe can exhibit the inherent characteristics.

The adhesion enhancing treatment can be combined with the formation of the adhesion enhancing layer so as to much enhance the intended adhesion between the adjacent layers. In the case that the adhesion enhancing treatment is combined with the process as shown in FIG. 6, the adhesion enhancing treatment is conducted for the surface of the bottom metallic layer 15 or the surface of the metallic layer 21LM mainly composing the adhesion enhancing layer.

The adhesion enhancing treatment can be combined with the formation of an adhesion enhancing layer which is formed at another interface as described below.

Figure 7:
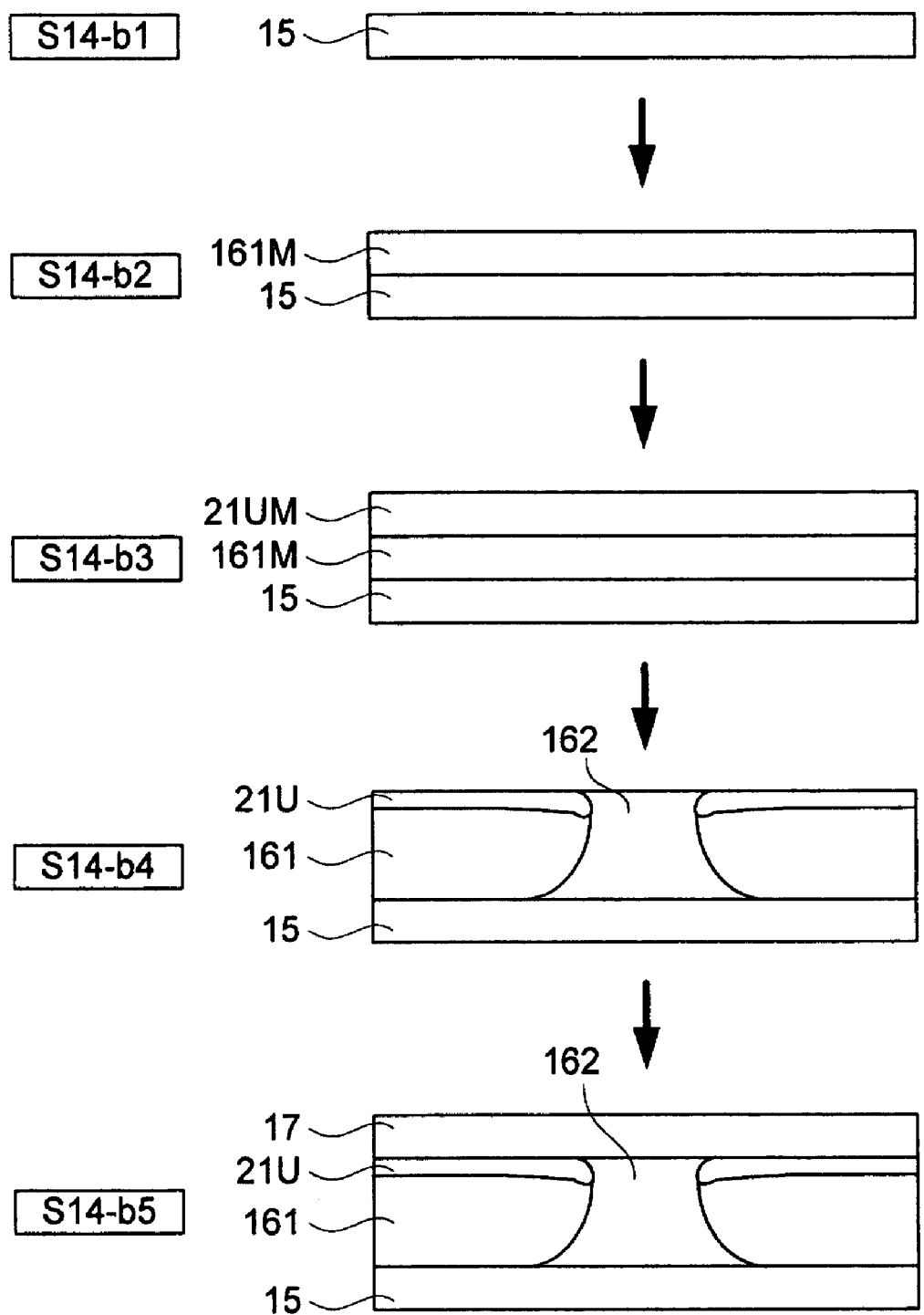
FIG. 7 is other views relating to the formation process of a spacer layer containing an adhesion developing layer.

FIG. 7 shows the formation process of the adhesion enhancing layer 21U as shown in FIG. 3 in detail. In this process, the matrix layer of the adhesion enhancing layer is formed and then, the CCP-NOL layer forming process is conducted for the matrix layer, thereby forming the adhesion enhancing layer at the interface between the insulating layer 161 and the metallic layer 17.

First of all, the metallic layer 15 is formed, e.g., as a Cu layer (S14-$b$1). Then, the matrix layer 161M mainly composing the CCP-NOL layer is formed (S14-$b$2). In this case, since the insulating layer 161 is made of Al$_2$O$_3$, the matrix layer 161M is made of AlCu or Al.

Then, the matrix metallic layer 21UM of the adhesion enhancing layer is formed (S14-$b$3). The matrix metallic layer 21UM may contain an element with an oxide formation energy higher than the oxide formation energy of the element composing the matrix layer of the insulating layer 161 and lower than the oxide formation energy of the element composing the metallic layers 17. Referring to Table 1, when the insulating layer 161 is made of Al$_2$O$_3$, the resultant adhesion enhancing layer 21L may contain Si, Hf, Ti, V, W, Mg, Mo, Cr or Zr.

Then, the insulating layer 161 and the current path 162 are formed (S14-$b$4). In the process, the metallic layer 21U is formed from the matrix metallic layer 21UM on the top surface of the insulating layer 161 during the formation of the insulating layer 161 and the current path 162.

Then, the top metallic layer 17 is formed, e.g., as the Cu layer with a thickness of 0.25 nm on the resultant CCP-NOL layer 16 (S14-$b$5). The thickness of the top metallic layer 17 is preferably set within 0.2 to 0.6 nm. If the thickness of the top metallic layer 17 is set to about 0.4 nm, the crystallinity of the free layer 18 can be easily enhanced. Since the crystallinity of the free layer 18 can be controlled by adjusting the film-forming condition, the top metallic layer 17 may be omitted as occasion demands.

Without the top metallic layer 17, the adhesion enhancing layer 21U is formed between the insulating layer 161 and the free layer 18. The main component element of the free layer 18 is Co, Fe and/or Ni. In this case, in order to exhibit the inherent function (adhesion enhancement) of the adhesion enhancing layer 21U, it is required that the element composing the adhesion enhancing layer 21U has a larger oxide formation energy than the one of the element(s) composing the free layer 18. Referring to Table 1, since an element such as Al, Si, Hf, Ti, V, W, Mg, Mo, Cr or Zr is larger in oxide formation energy than Co, Fe and Ni, the exemplified element can be used as a component element for the adhesion enhancing layer.

Figure 8:
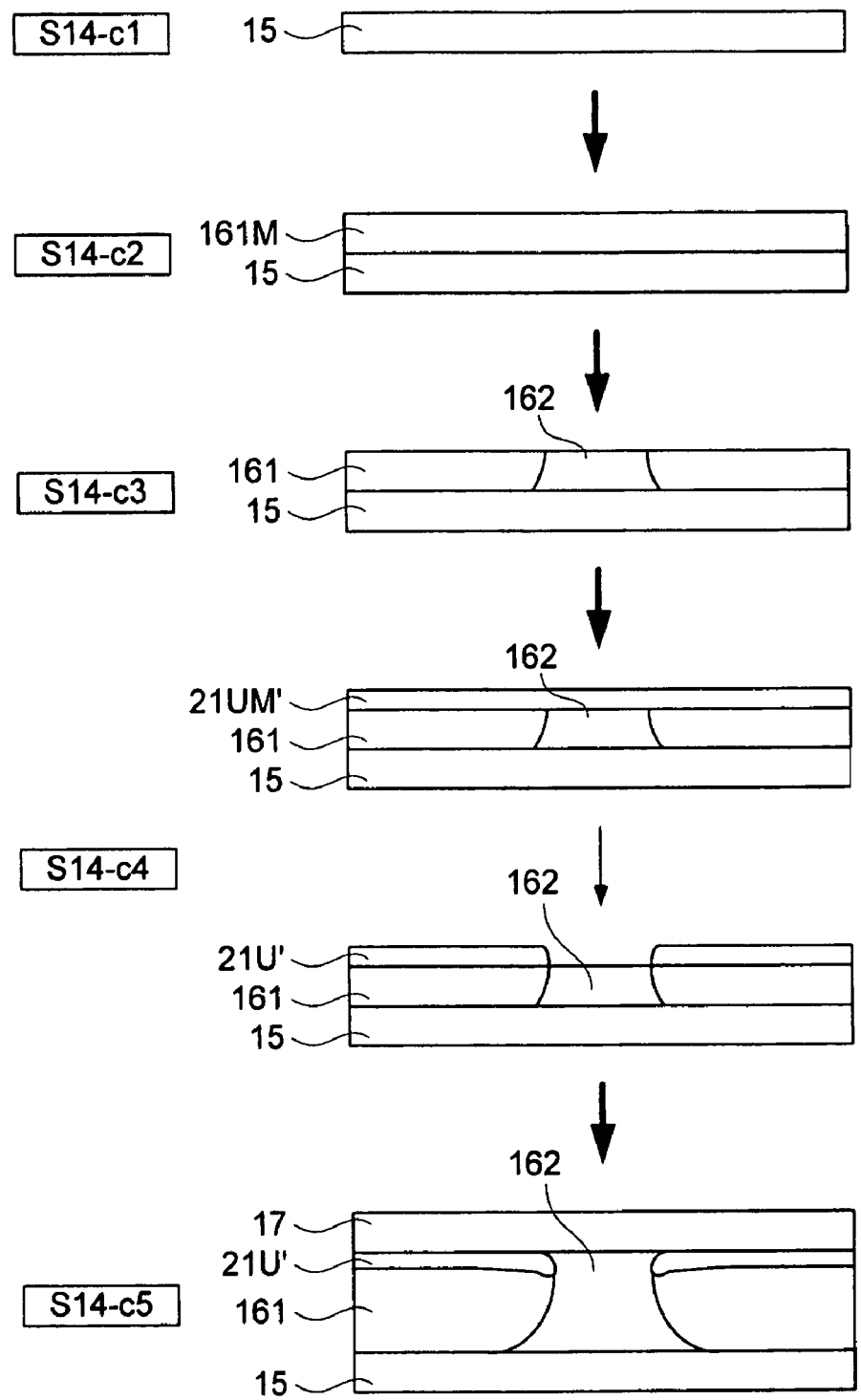
FIG. 8 is also other views relating to the formation process of a spacer layer containing an adhesion developing layer.

FIG. 8 also shows the formation process of the adhesion enhancing layer 21U as shown in FIG. 3 in detail. In this process, the CCP-NOL layer forming process is conducted and then, the matrix layer of the adhesion enhancing layer is formed, thereby forming the adhesion enhancing layer at the interface between the insulating layer 161 and the metallic layer 17.

First of all, the metallic layer 15 is formed, e.g., as a Cu layer (S14-$c$1). Then, the matrix layer 161M mainly composing the CCP-NOL layer is formed (S14-$c$2). In this case, since the insulating layer 161 is made of Al$_2$O$_3$, the matrix layer 161M is made of AlCu or Al. Then, the insulating layer 161 and the current path 162 are formed (S14-$c$3).

Then, the matrix metallic layer 21UM' of the adhesion enhancing layer is formed (S14-$c$4). The matrix metallic layer 21UM' may contain an element with an oxide formation energy higher than the oxide formation energy of the element composing the matrix layer of the insulating layer 161 and lower than the oxide formation energy of the element composing the metallic layers 17. In this case, however, the matrix metallic layer may contain the same component element as the component element of the insulating layer 161, which will be described in detail, hereinafter. In this step, the adhesion enhancing layer 21U is formed from the metallic layer 21UM' on the insulating layer 161.

The reason the adhesion enhancing layer 21U' may contain the same component element as the component element of the insulating layer 161 will be described. In the process as shown in FIG. 8, since the matrix metallic layer 21 of the adhesion enhancing layer 21U' is formed after the oxidation for the matrix layer 161M of the insulating layer 161, the coupling between the elemental Al and the elemental oxygen of the insulating layer 161 is strengthened. In this point of view, if the adhesion enhancing layer 21U' contains the elemental Al, the elemental oxygen of the insulating layer 161, e.g., made of $Al_2O_3$, is unlikely to be moved into the adhesion enhancing layer 21U' so that the content in oxygen of the adhesion enhancing layer 21U' becomes different from the content in oxygen of the insulating layer 161. As a result, the content in oxygen of the adhesion enhancing layer 21U' can be reduced in the vicinity of the metallic layer to be formed on the adhesion enhancing layer 21U'.

Then, the top metallic layer 17 is formed, e.g., as the Cu layer with a thickness of 0.25 nm on the resultant CCP-NOL layer 16 (S14-c5). The thickness of the top metallic layer 17 is preferably set within 0.2 to 0.6 nm. If the thickness of the top metallic layer 17 is set to about 0.4 nm, the crystallinity of the free layer 18 can be easily enhanced. Since the crystallinity of the free layer 18 can be controlled by adjusting the film-forming condition, the top metallic layer 17 may be omitted as occasion demands.

Without the top metallic layer 17, the adhesion enhancing layer 21U' is formed between the insulating layer 161 and the free layer 18. The main component element of the free layer 18 is Co, Fe and/or Ni. In this case, in order to exhibit the inherent function (adhesion enhancement) of the adhesion enhancing layer 21U', it is required that the element composing the adhesion enhancing layer 21U' has a larger oxide formation energy than the one of the element(s) composing the free layer 18. Referring to Table 1, since an element such as Al, Si, Hf, Ti, V, W, Mg, Mo, Cr or Zr is larger in oxide formation energy than Co, Fe and Ni, the exemplified element can be used as a component element for the adhesion enhancing layer 21U'.

Figure 9:
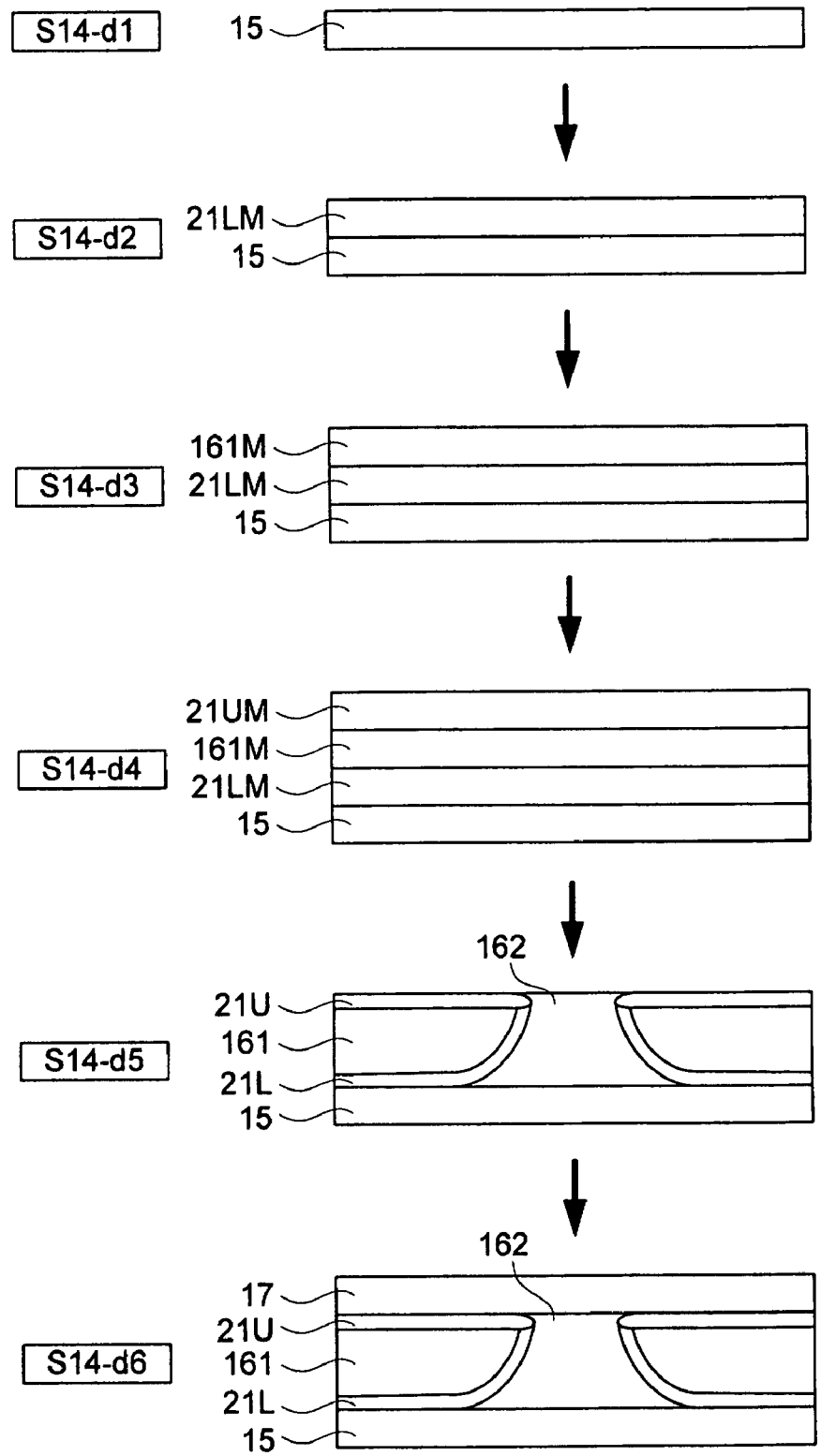
FIG. 9 is further other views relating to the formation process of a spacer layer containing an adhesion developing layer.

FIG. 9 shows the formation process of the adhesion enhancing layers 21L and 21U as shown in FIG. 4 in detail. In this process, the matrix layer of the adhesion enhancing layer is formed according to the process as shown in FIG. 7 and then, the CCP-NOL layer forming process is conducted for the matrix layer, thereby forming the adhesion enhancing layers 21L and 21U at the interfaces between the insulating layer 161 and the metallic layers 15, 17.

First of all, the metallic layer 15 is formed, e.g., as a Cu layer (S14-d1). Then, the matrix metallic layer 21LM of the adhesion enhancing layer 21L is formed (S14-d2). The matrix metallic layer 21LM may contain an element with an oxide formation energy higher than the oxide formation energy of the element composing the matrix layer of the insulating layer 161 and lower than the oxide formation energy of the element composing the metallic layers 15. Referring to Table 1, when the insulating layer 161 is made of $Al_2O_3$, the resultant adhesion enhancing layer 21L may contain Si, Hf, Ti, V, W, Mg, Mo, Cr or Zr.

Then, the matrix metallic layer 161M of the CCP-NOL layer 16 is formed (S14-d3). In this case, since the insulating layer 161 is made of $Al_2O_3$, the matrix metallic layer 161M is made of AlCu or Al.

Then, the matrix metallic layer 21UM of the adhesion enhancing layer 21U is formed (S14-d4). The matrix metallic layer 21UM may contain an element with an oxide formation energy higher than the oxide formation energy of the element composing the matrix layer of the insulating layer 161 and lower than the oxide formation energy of the element composing the metallic layers 17. In this case, since the insulating layer 161 is made of $Al_2O_3$, the matrix metallic layer 161M is made of AlCu or Al.

Then, the insulating layer 161 and the current path 162 are formed (S14-d5). In the process, the metallic layers 21L and 21U are formed from the matrix metallic layers 21LM and 21UM so as to cover the insulating layer 161 during the formation of the insulating layer 161 and the current path 162.

Figure 10:
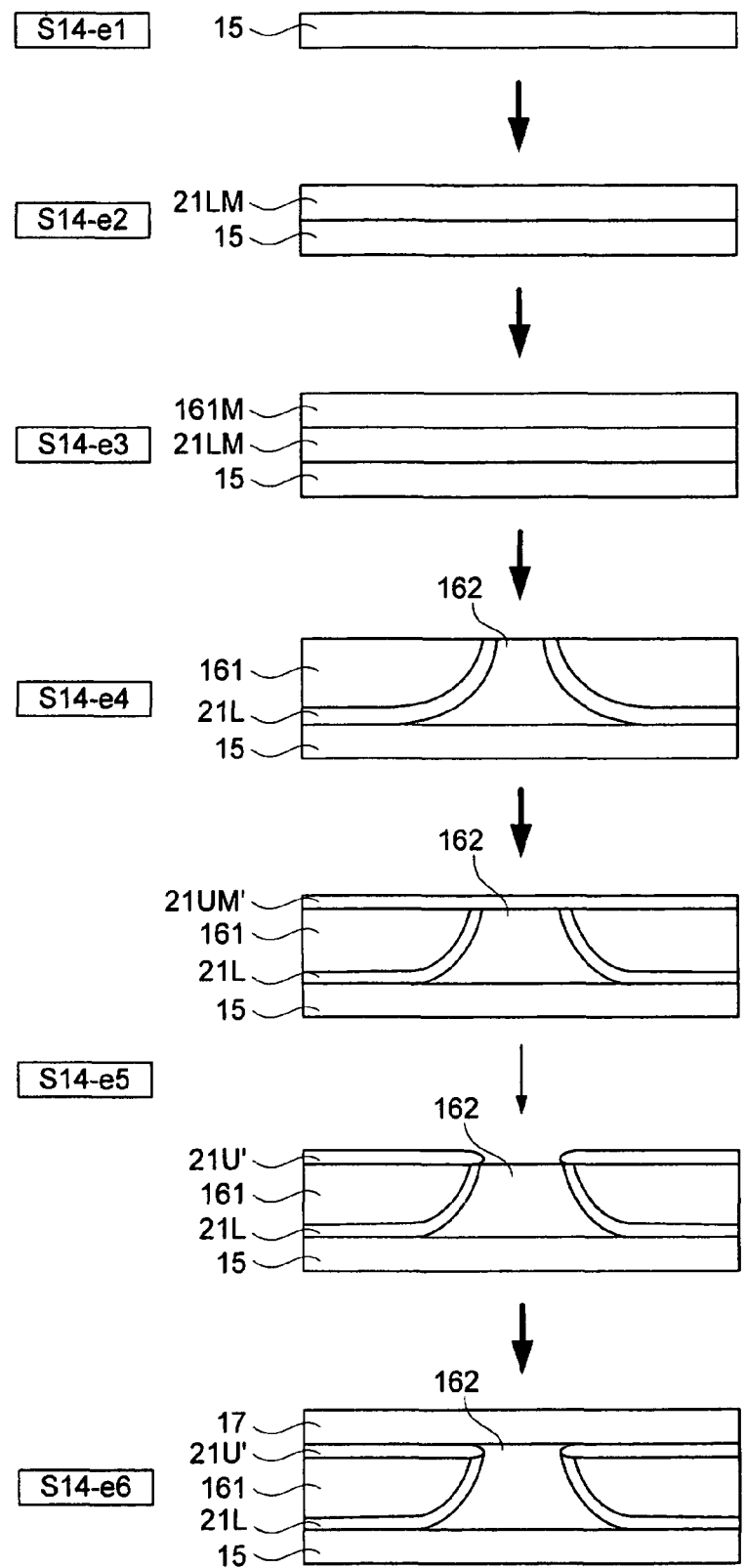
FIG. 10 is still further other views relating to the formation process of a spacer layer containing an adhesion developing layer.

FIG. 10 also shows the formation process of the adhesion enhancing layers 21L and 21U as shown in FIG. 4 in detail. In this process, the matrix layer of the adhesion enhancing layer is formed according to the process as shown in FIG. 7 and then, the CCP-NOL layer forming process is conducted for the matrix layer, thereby forming the adhesion enhancing layers 21L at the interface between the insulating layer 161 and the metallic layers 15. Then, the adhesion enhancing layer 21U' is formed at the interface between the insulating layer 161 and the metallic layer 17 according to the process as shown in FIG. 8.

First of all, the metallic layer 15 is formed, e.g., as a Cu layer (S14-e1). Then, the matrix metallic layer 21LM of the adhesion enhancing layer 21L is formed (S14-e2). The matrix metallic layer 21LM may contain an element with an oxide formation energy higher than the oxide formation energy of the element composing the matrix layer of the insulating layer 161 and lower than the oxide formation energy of the element composing the metallic layers 15. Referring to Table 1, when the insulating layer 161 is made of $Al_2O_3$, the resultant adhesion enhancing layer 21L may contain Si, Hf, Ti, V, W, Mg, Mo, Cr or Zr.

Then, the matrix metallic layer 161M of the CCP-NOL layer 16 is formed (S14-e3). In this case, since the insulating layer 161 is made of $Al_2O_3$, the matrix metallic layer 161M is made of AlCu or Al.

Then, the insulating layer 161 and the current path 162 are formed (S14-e4). In the process, the adhesion enhancing 21L is formed from the matrix metallic layer 21LM at the interface between the insulating layer 161 and the metallic layer 15 and the interface between the insulating layer 161 and the current path 162.

Then, the matrix metallic layer 21UM' of the adhesion enhancing layer 21U' is formed (S14-d4). The matrix metallic layer 21UM' may contain an element with an oxide formation energy higher than the oxide formation energy of the element composing the matrix layer of the insulating layer 161 and lower than the oxide formation energy of the element composing the metallic layers 17. Moreover, the matrix metallic layer 21UM' may contain the same component element as the component element of the insulating layer 161 on the same reason relating to the process as shown in FIG. 8. In this step, the adhesion enhancing layer 21U' is formed from the metallic layer 21UM' on the insulating layer 161.

(Apparatus to be Employed for Manufacturing a Magneto-Resistance Effect Element)

Figure 11:
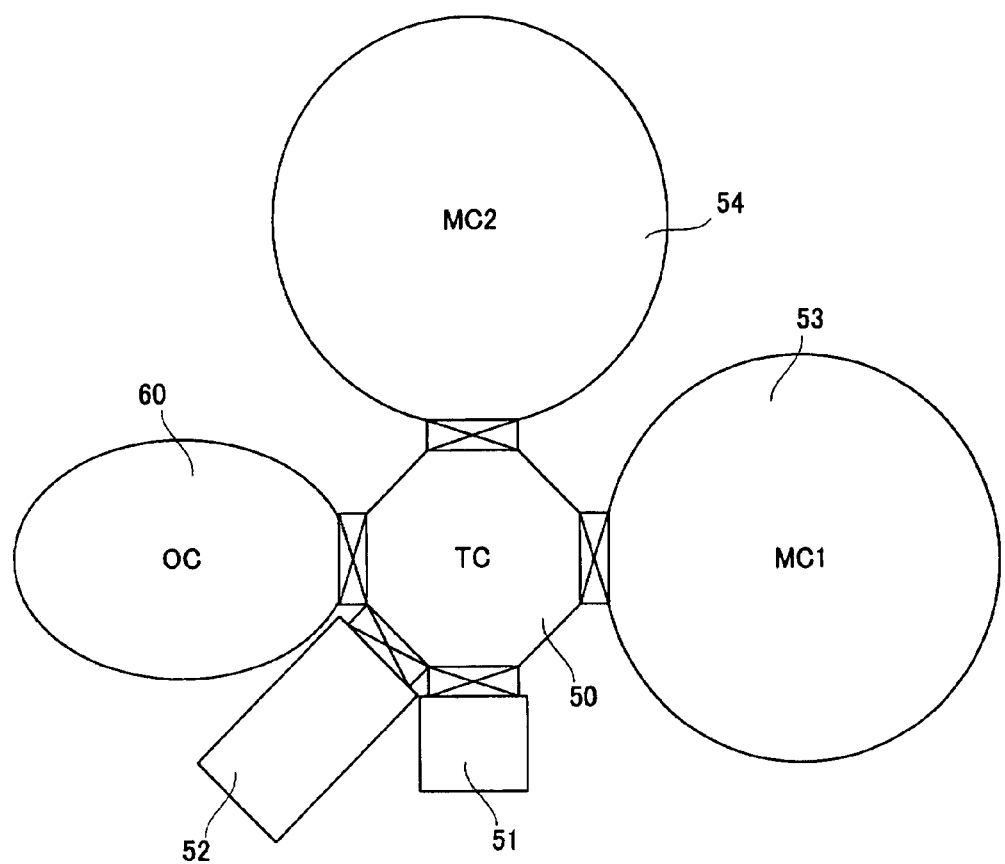
FIG. 11 is a schematic view illustrating a film forming apparatus for manufacturing a magneto-resistance effect element according to the present invention.

FIG. 11 is a schematic view illustrating a film forming apparatus for manufacturing a magneto-resistance effect element according to the present invention. As shown in FIG. 11, the transfer chamber (TC) 50 is disposed at the center of the apparatus such that the load lock chamber 51, the pre-cleaning chamber 52, the first metallic film-forming chamber (MC1) 53, the second metallic film-forming chamber (MC2) 54 and the oxide layer-nitride layer forming chamber (OC) 60 are disposed so as to be connected with the transfer chamber 50 via the gate valves, respectively. In the apparatus, the substrate on which various films are to be formed is transferred from one chamber from another chamber under the vacuum condition via the corresponding gate valve. Therefore, the surface of the substrate can be maintained clean.

The metallic film-forming chambers 53 and 54 include a plurality of targets (five to ten targets) which is called as a multi-structured target. As the film forming means, a sputtering method such as a DC magnetron sputtering or an RF magnetron sputtering, an ion beam sputtering, a vacuum deposition, a CVD (Chemical Vapor Deposition) or an MBE (Molecular Beam Epitaxy) can be employed.

(Schematic Explanation of the Method for Manufacturing a Magneto-Resistance Effect Element)

Hereinafter, the method for manufacturing a magneto-resistance effect element will be schematically described. First of all, on the substrate (not shown) are subsequently formed the bottom electrode 11, the underlayer 12, the pinning layer 13, the pinned layer 14, the bottom metallic layer 15, the spacer layer 16, the top metallic layer 17, the free layer 18, the cap layer 19 and the top electrode 20.

A substrate is set into the load lock chamber 51 so that some metallic films are formed in the metallic film-forming chambers 53 and 54 and some oxide and/or nitride layers are formed in the oxide layer-nitride layer forming chamber 60. The ultimate vacuum of the metallic film-forming chambers 53 and 54 is preferably set to $1 \times 10^{-8}$ Torr or below, normally within a range of $5 \times 10^{-10}$ Torr to $5 \times 10^{-9}$ Torr. The ultimate vacuum of the transfer chamber 50 is set in the order of $10^{-9}$ Torr. The ultimate vacuum of the oxide layer-nitride layer forming chamber 60 is set to $8 \times 10^{-8}$ Torr or below.

(1) Formation of Underlayer 12 (Step S11)

The bottom electrode 11 is formed on the (not shown) substrate by means of micro-process in advance. Then, the underlayer 12 is formed as a layer of Ta 5 nm/Ru 2 nm on the bottom electrode 11. The Ta layer functions as the buffer layer 12a for relaxing the surface roughness of the bottom electrode 11. The Ru layer functions as the seed layer 12b for controlling the crystalline orientation and the crystal grain of the spin valve film to be formed thereon.

(2) Formation of Pinning Layer 13 (Step S12)

Then, the pinning layer 13 is formed on the underlayer 12. The pinning layer 13 may be made of an antiferromagnetic material such as PtMn, PdPtMn, IrMn, RuRhMn.

(3) Formation of Pinned Layer 14 (Step S13)

Then, the pinned layer 14 is formed on the pinning layer 13. The pinned layer 14 may be formed as the synthetic pinned layer of the bottom pinned layer 141 ($Co_{90}Fe_{10}$)/the magnetic coupling layer 142 (Ru)/the top pinned layer 143 ($Co_{90}Fe_{10}$).

(4) Formation of CCP-NOL Layer 16 (Step S14)

Then, the CCP-NOL layer 16 with the current-confined-path structure (CCP structure) is formed in the oxide layer-nitride layer forming chamber 60. The CCP-NOL layer 16 can be formed in the same manner as "Method for manufacturing a magneto-resistance effect element". By forming the adhesion enhancing layer at the interface between the insulating layer 161 and the metallic layer 15, the current path 162 or at the interface between the insulating layer 161 and the metallic layer 17 or the free layer 18, the reliability of the magneto-resistance effect element can be developed.

(5) Formation of Free Layer 18 (Step S15)

In order to realize the higher MR ratio of the magneto-resistance effect element, the appropriate material selection for the free layer 18 in the vicinity of the spacer 16 should be considered. In this point of view, it is desired to form the NiFe alloy film or the CoFe alloy film at the interface between the free layer 18 and the spacer layer 16. The CoFe alloy film is more preferable than the NiFe alloy film. As the CoFe alloy film, the $Co_{90}Fe_{10}$ layer with a thickness of 1 nm can be exemplified. Of course, the CoFe alloy layer can contain anther composition.

If the CoFe alloy layer with a composition almost equal to the one of the $Co_{90}Fe_{10}$ layer is employed, the thickness of the CoFe alloy layer is preferably set within 0.5 to 4 nm. If the CoFe alloy layer with a composition (e.g., $CO_5OFe_{50}$) different from the one of the $Co_{90}Fe_{10}$ layer is employed, the thickness of the CoFe alloy layer is preferably set within 0.5 to 2 nm. If the free layer 18 is made of $Fe_{50}Co_{50}$ (or $Fe_XCo_{1-X}$ (X=45~85)) in view of the enhancement in spin dependent interface scattering effect, it is difficult to set the thickness of the free layer 18 as thick as the pinned layer 14 so as to maintain the soft magnetism of the free layer 18. In this case, therefore, the thickness of the free layer 18 is preferably set within 0.5 to 1 nm. If the free layer 18 is made of Fe or Fe alloy without Co, the thickness of the free layer 18 may be increased within 0.5 to 4 nm because the soft magnetism of the free layer can be maintained under good condition.

The NiFe alloy layer can maintain stably the inherent soft magnetism, but the CoFe alloy layer can not maintain stably inherent soft magnetism in comparison with the NiFe alloy layer. In this case, if the NiFe alloy layer is formed on the CoFe alloy layer, the soft magnetism of the CoFe alloy can be compensated with the soft magnetism of the NiFe alloy layer. In this point of view, the formation of the NiFe alloy layer at the interface between the free layer 18 and the spacer layer 16 can develop the MR ratio of the spin valve film, that is, the magneto-resistance effect element.

The composition of the NiFe alloy layer is preferably set to $Ni_XFe_{100-X}$ (X=75 to 85%). Particularly, the composition of the NiFe alloy layer is preferably set to a Ni-rich composition in comparison with the normal composition of $Ni_{81}Fe_{19}$ (e.g., $Ni_{83}Fe_{17}$) so as to realize the non-magnetostriction of the NiFe layer. The magnetostriction of the NiFe alloy layer is shifted positive when the NiFe alloy layer is formed on the CCP-structured spacer 16 in comparison with the magnetostriction of the NiFe alloy layer when the NiFe alloy layer is formed on a Cu spacer. In this point of view, the composition of the NiFe alloy layer is shifted to a Ni-rich composition in advance so as to cancel the positive magnetostriction of the NiFe alloy layer formed on the spacer layer 16 because the Ni-rich NiFe alloy layer can exhibit the negative magnetostriction.

The thickness of the NiFe layer may be set preferably within 2 to 5 nm (e.g., 3.5 nm). Without the NiFe layer, a plurality of CoFe layers or Fe layers with a thickness of 1 to 2 nm and a plurality of thinner Cu layers with a thickness of 0.1 to 0.8 nm are alternately stacked one another, thereby forming the free layer 18.

(6) Formation of Cap Layer 19 and Top Electrode (Step S16)

The cap layer 19 is formed as a multilayer of Cu 1 nm/Ru 10 nm on the free layer 18. Then, the top electrode 20 is formed on the cap layer 19 so as to flow a current to the spin valve film in the direction perpendicular to the film surface thereof.

EXAMPLES

The present invention will be described in detail in view of Examples.

Example 1

| Bottom electrode 11 | |
|---|---|
| Underlayer 12 | Ta 5 nm/Ru 2 nm |
| Pinning layer 13 | $Ir_{22}Mn_{78}$ 7 nm |
| Pinned layer 14 | $Co_{75}Fe_{25}$ 3.2 nm/Ru 0.9 nm/$Fe_{50}Co_{50}$ 1 nm/Cu 0.25 nmx2/$Fe_{50}Co_{50}$ 1 nm |
| Metallic layer 15 | Cu 0.5 nm |
| CCP-NOL layer 16 | adhesion enhancing layer | composed of insulating layer 161 of $Al_2O_3$, current path 162 of Cu and Ti layer (the multilayer of Ti 0.25 nm/$Al_{90}Cu_{10}$ 1 nm/Ti 0.25 nm is formed and treated by means of PIT/IAO)

| Metallic layer 17 | Cu 0.25 nm |
| --- | --- |
| Free layer 18 | $Co_{90}Fe_{10}$ 1 nm/$Ni_{83}Fe_{17}$ 3.5 nm |
| Cap layer 19 | Cu 1 nm/Ru 10 nm |
| Top electrode 20 | |

The manufacturing process of the CCP-NOL layer 16 will be described. The manufacturing processes of other layers can be conducted by means of conventional techniques and thus, will be omitted.

First of all, the metallic layer 15 was formed as a Cu layer with a thickness of 0.5 nm. Then, the matrix metallic layer of the adhesion enhancing layer was formed as a Ti layer with a thickness of 0.25 nm. The Ti layer constitutes the lower portion of the adhesion enhancing layer, and has an oxide formation energy higher than the elemental Al mainly composing the matrix material $Al_{90}Cu_{10}$ of the CCP-NOL layer and lower than the elemental Cu of the metallic layer 15. Instead of the Ti layer, the matrix metallic layer of the adhesion enhancing layer may be made of Si, Hf, V, W, Mg, Mo, Cr, Nb or Zr.

Then, the $Al_{90}Cu_{10}$ layer with a thickness of 1 nm as the matrix material $Al_2O_3$ of the insulating layer was formed. Then, the Ti layer with a thickness of 0.25 nm as the matrix material constituting the upper portion of the adhesion enhancing layer was formed. Then, the $Al_2O_3$ insulating layer and the Cu current path 162 formation process was conducted by means of PIT/IAO process.

Throughout the above-described process, in the CCP-NOL layer composed of the $Al_2O_3$ insulating layer 161, the Cu current path 162, the intended adhesion enhancing layer was formed at the interface between the insulating layer 161 and the metallic layer 15, at the interface between the insulating layer 161 and the current path 162 and at the interface between the insulating layer 161 and the metallic layer 17.

When the resultant magneto-resistance effect element (CCP-CPP element) 10 was observed by means of three-dimensional atomic probe, it was confirmed that the adhesion enhancing layer containing elemental Ti as a main component was formed at the interface between the insulating layer 161 and the adjacent metallic layers.

Then, the various characteristics of the CCP-CPP element were investigated. As a result, the element resistance RA was 500 mΩ/μm, the MR ratio was 9% and the element resistance variation ΔRA was 45 mΩ/μm². These characteristics are almost equal to the ones of a CCP-CPP element without the adhesion enhancing layer.

Then, the reliability of the CCP-CPP element was investigated. The current flow test was carried out under the condition that the temperature was 130° C., and the biasing voltage was 140 mV. In this investigation, the current flow condition was set to a severe one so as to obtain the result in the current flow test of the CCP-CPP element immediately. The current flow direction was set so that the current was flowed from the pinned layer 14 to the free layer 18. In this case, the electron flow was generated from the free layer 18 to the pinned layer 14 opposite of the current direction.

The current flow direction is favorable for the reduction of the spin transfer noise. Allegedly, the spin transfer effect becomes large when the current is flowed from the free layer 18 to the pinned layer 14 (the electron flow is generated from the pinned layer 14 to the free layer 18), which leads to the noise generation in the CCP-CPP element. In this point of view, it is desired that the current is flowed from the pinned layer to the free layer.

As described above, the test condition was set to a severe one for the acceleration of the reliability test for the CCP-CPP element. In this embodiment, the chip size of the CCP-CPP element to be employed in a magnetic head was set larger than a normal chip size (e.g., 0.1 μm×0.1 μm). The amount of current flow is increased under a given biasing voltage and thus, the heat radiation performance of the CCP-CPP element may be deteriorated as the chip size of the CCP-CPP element is increased. In this point of view, in this embodiment, the thus generated Joule heat affects the CCP-CPP element remarkably in comparison with the real CCP-CPP element to be employed in the magnetic head. In view of the Joule heat, therefore, the reliability of the CCP-CPP element is tested under a severe condition. If the biasing voltage is increased and the testing temperature is increased, the reliability of the CCP-CPP element results in being tested under a more severe condition so as to accelerate the reliability test and shorten the testing period of time.

When the current flow test was carried out under the severe accelerating condition, it was confirmed that the reliability of the CCP-CPP element was enhanced remarkably in comparison with a CCP-CPP element without the adhesion enhancing layer.

The higher reliability of the CCP-CPP element under the severe condition in this embodiment means that the CCP-CPP element can be employed under an environmental condition requiring higher reliability. In view of the application of the CCP-CPP element to a high density recording head, the reliability of the recording head can be enhanced remarkably in comparison of a conventional high density recording head. Thus, the high density recording head can be applied for a car navigation system requiring a severe use condition such as high temperature environment or for an HDD (Hard disk drive) of a server or an enterprise which is operated at high speed.

Example 2

In this Example, the formation process of the adhesion enhancing layer to be formed on the insulating layer 161 was changed in comparison with Example 1. In Example 1, the matrix Ti layer of the adhesion enhancing layer is formed at the upper interface for the insulating layer 161, and then, treated by means of PIT/IAO process. In Example 2, the PIT/IAO process was conducted in advance and then, the matrix Ti layer of the adhesion enhancing layer was formed.

In this case, the matrix layer of the adhesion enhancing layer can contain an element with an oxide formation energy almost equal to the oxide formation energy of the element of the insulating layer 161, in addition to the element with a lower oxide formation energy than the element of the insulating layer 161 such as Ti, Al, Si, Hf, V, W, Mg, Mo, Cr or Zr.

When the resultant magneto-resistance effect element (CCP-CPP element) 10 was observed by means of three-dimensional atomic probe, it was confirmed that the adhesion enhancing layer containing elemental Ti as a main component was formed at the interface between the insulating layer 161 and the adjacent metallic layers.

Then, the various characteristics of the CCP-CPP element were investigated. As a result, the element resistance RA was 500 mΩ/μm, the MR ratio was 9% and the element resistance variation ΔRA was 45 mΩ/μm². These characteristics are almost equal to the ones of a CCP-CPP element without the adhesion enhancing layer. Then, when the current flow test was carried out under the severe accelerating condition in the same manner, it was confirmed that the reliability of the CCP-CPP element was enhanced remarkably in comparison with a CCP-CPP element without the adhesion enhancing layer.

(Application of Magneto-Resistance Effect Element)

The application of the magneto-resistance effect element according to this embodiment will be described hereinafter, In view of high density recording, the element resistance RA is set preferably to 500 mΩ/μm or below, more preferably to 300 mΩ/μm or below. In the calculation of the element resistance RA, the effective area A in current flow of the spin valve film is multiplied to the resistance R of the CPP-CPP element. Herein, the element resistance R can be directly measured, but attention should be paid to the effective area A because the effective area A depends on the element structure.

If the whole area of the spin valve film is effectively sensed by current through patterning, the whole area of the spin valve film corresponds to the effective area A. In this case, the whole area of the spin valve film is set to 0.04 μm² or below in view of the appropriate element resistance, and to 0.02 μm² or below in view of the recording density of 200 Gbpsi or over.

If the area of the bottom electrode 11 or the top electrode 20 is set smaller than the whole area of the spin valve film, the area of the bottom electrode 11 or the top electrode 20 corresponds to the effective area A. If the area of the bottom electrode 11 is different from the area of the top electrode 20, the smaller area of either of the bottom electrode 11 or the top electrode 20 corresponds to the effective area A. As described above, the smaller area is set to 0.04 μm² or below in view of the appropriate element resistance Referring to FIGS. 12 and 13, since the smallest area of the spin valve film 10 corresponds to the contacting area with the top electrode 20 as apparent from FIG. 12, the width of the smallest area can be considered as a track width Tw. Then, since the smallest area of the spin valve film 10 in MR height direction also corresponds to the contacting area with the top electrode 20 as apparent from FIG. 13, the width of the smallest are can be considered as a height length D. In this case, the effective area A can be calculated on the equation of A=Tw×D.

In the magneto-resistance effect element according to this embodiment, the resistance R between the electrodes can be reduced to 100Ω or below, which corresponds to the resistance between the electrode pads in the reproducing head attached to the forefront of a head gimbal assembly (HGA), for example.

It is desired that the magneto-resistance effect element is structured in fcc (111) orientation when the pinned layer 14 or the free layer 18 has the fcc-structure. It is also desired that the magneto-resistance effect element is structured in bcc. (100) orientation when the pinned layer 14 or the free layer 18 has the bcc-structure. It is also desired that the magneto-resistance effect element is structured in hcp (001) orientation when the pinned layer 14 or the free layer 18 has the hcp-structure.

The crystalline orientation of the magneto-resistance effect element according to this embodiment is preferably 4.5 degrees or below, more preferably 3.5 degrees or below and particularly 3.0 degrees or below in view of the dispersion of orientation. The crystalline orientation can be measured from the FWHM of X-ray rocking curve obtained from the θ-2θ measurement in X-ray diffraction. The crystalline orientation can be also measured by the spot scattering angle originated from the nano-diffraction spots of the element cross section.

Depending on the kind of material of the antiferromagnetic film, since the lattice spacing of the antiferromagnetic film is different from the lattice spacing of the pinned layer 14/CCP-NOL layer 16/free layer 18, the dispersion in crystalline orientation can be obtained between the antiferromagnetic film and the pinned layer 14/CCP-NOL layer 16/free layer 18. For example, the lattice spacing of the PtMn antiferromagnetic layer is often different from the lattice spacing of the pinned layer 14/CCP-NOL layer 16/free layer 18. In this point of view, since the PtMn layer is formed thicker, the PtMn layer is suitable for the measurement in dispersion of the crystal orientation. With the pinned layer 14/CCP-NOL layer 16/free layer 18, the pinned layer 14 and the free layer 18 may have the respective different crystal structures of bcc-structure and fcc-structure. In this case, the dispersion angle in crystal orientation of the pinned layer 14 may be different from the dispersion angle in crystal orientation of the free layer 18.

(Magnetic Head)

Figure 12:
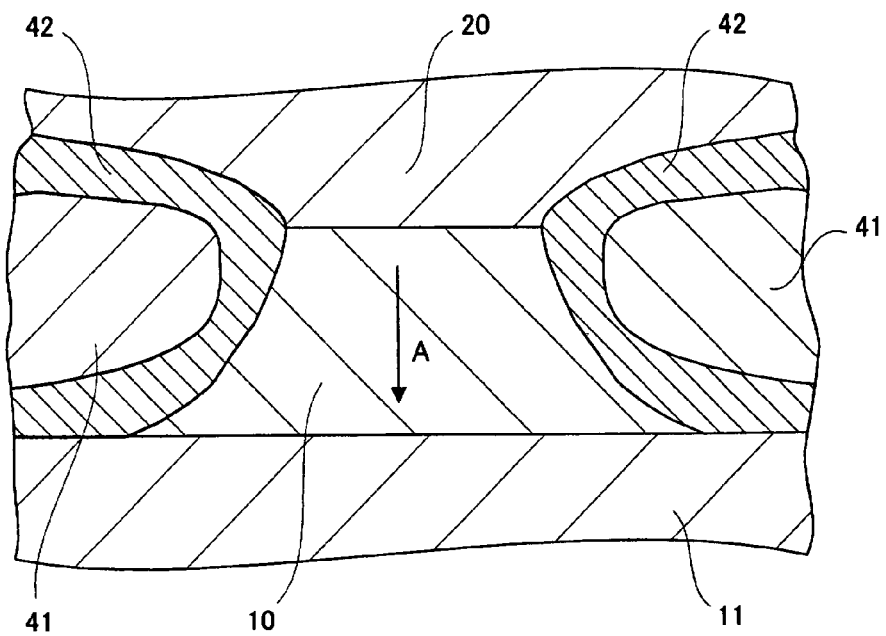
FIG. 12 is a cross sectional view showing the state where the magneto-resistance effect element as described in an embodiment of the present invention is incorporated in a magnetic head.
Figure 13:
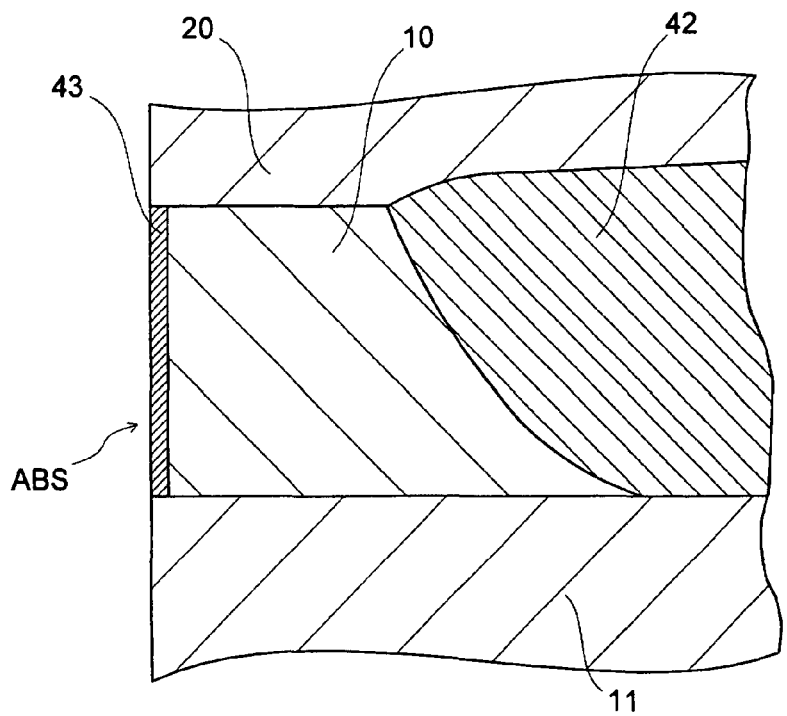
FIG. 13 is another cross sectional view showing the state where the magneto-resistance effect element as described in an embodiment of the present invention is incorporated in a magnetic head.

FIGS. 12 and 13 are cross sectional views showing the state where the magneto-resistance effect element according to this embodiment is incorporated in a magnetic head. FIG. 12 is a cross sectional view showing the magneto-resistance effect element, taken on the surface almost parallel to the ABS (air bearing surface) opposite to a (not shown) magnetic recording medium. FIG. 13 is a cross sectional view showing the magneto-resistance effect element, taken on the surface almost perpendicular to the ABS.

The magnetic head shown in FIGS. 12 and 13 has a so-called hard abutted structure. The magneto-resistance effect film 10 is the CCP-CPP film as described above. The bottom electrode 11 and the top electrode 20 are provided on the top surface and the bottom surface of the magneto-resistance effect film 10, respectively. In FIG. 12, the biasing magnetic applying films 41 and the insulating films 42 are formed at the both sides of the magneto-resistance effect film 10. In FIG. 13, the protective layer 43 is formed on the ABS of the magneto-resistance effect film 10.

The sense current is flowed along the arrow A through the magneto-resistance effect film 10 between the bottom electrode 11 and the top electrode 20, that is, in the direction perpendicular to the film surface of the magneto-resistance effect film 10. Moreover, a given biasing magnetic field is applied to the magneto-resistance effect film 10 from the biasing magnetic field applying films 41 so as to render the domain structure of the free layer 18 of the film 10 a single domain structure through the control of the magnetic anisotropy of the free layer 18 and stabilize the magnetic domain structure of the free layer 18. In this case, the Barkhausen noise due to the shift of magnetic wall in the magneto-resistance effect film 10 can be prevented.

Since the S/N ratio of the magneto-resistance effect film 10 is enhanced, the magnetic head including the magneto-resistance effect film 10 can realize the high sensitive magnetic reproduction.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 14:
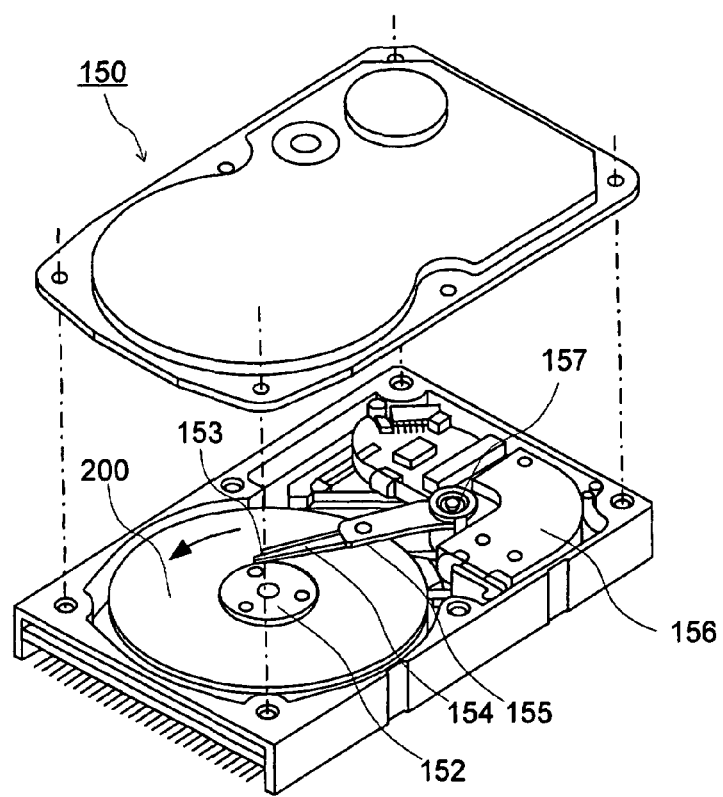
FIG. 14 is a perspective view illustrating an essential part of a magnetic recording/reproducing device according to the present invention.

FIG. 14 is a perspective view illustrating the schematic structure of the magnetic recording/reproducing device. The magnetic recording/reproducing device 150 illustrated in FIG. 14 constitutes a rotary actuator type magnetic recording/reproducing device. In FIG. 14, a magnetic recording disk 200 is mounted to a spindle 152 to be turned in the direction designated by the arrow A by a motor (not shown) which is driven in response to control signals from a drive unit controller (not shown). In FIG. 14, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200.

The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 15:
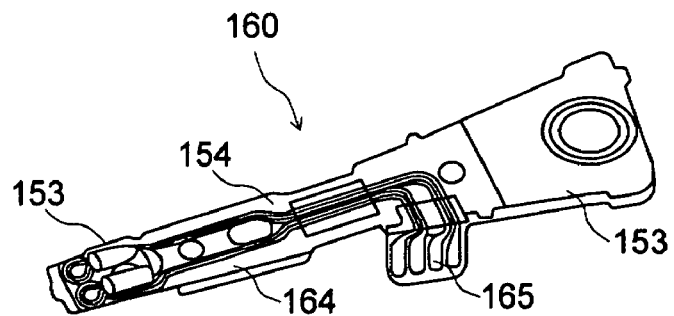
FIG. 15 is an enlarged perspective view illustrating the magnetic head assembly of the magnetic recording/reproducing device which is located forward from the actuator arm, as viewed from the side of the disk.

FIG. 15 is an enlarged perspective view illustrating a portion of the magnetic head assembly positioned at the tip side thereof from the actuator arm 155, as viewed from the side of the magnetic recording disk 200. As illustrated in FIG. 15, the magnetic head assembly 160 has the actuator arm 155 with the bobbin portion supporting the driving coil and the like. The suspension 154 is connected with the one edge of the actuator arm 155. Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 14 and 15, since the magneto-resistance effect element as described in the above embodiments is installed, the information magnetically recorded in the magnetic recording disk 200 can be read out properly.

(Magnetic Memory)

The magneto-resistance effect element as described above can constitute a magnetic memory such as a magnetic random access memory (MRAM) where memory cells are arranged in matrix.

Figure 16:
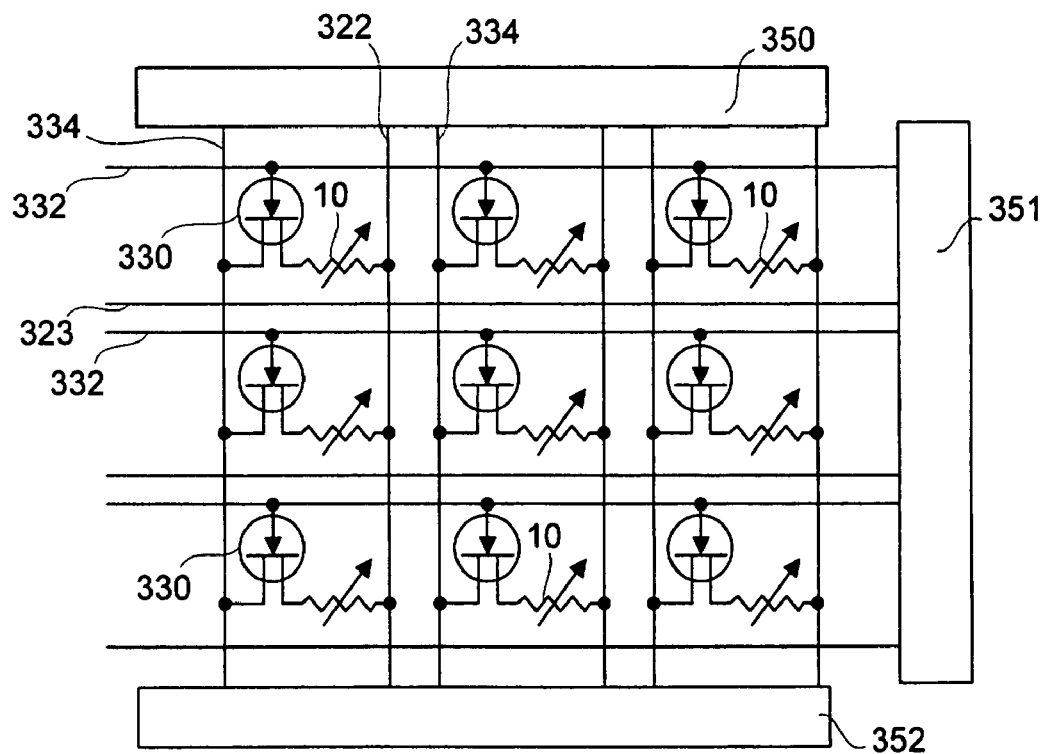
FIG. 16 is a view illustrating a magnetic memory matrix according to the present invention.

FIG. 16 is a view illustrating an embodiment of the magnetic memory matrix according to the present invention. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be readout by being detected by a sense amplifier 352. In order to write the bit information, a writing current is flowed in a specific write word line 323 and a bit line 322 to generate a magnetic field for writing.

Figure 17:
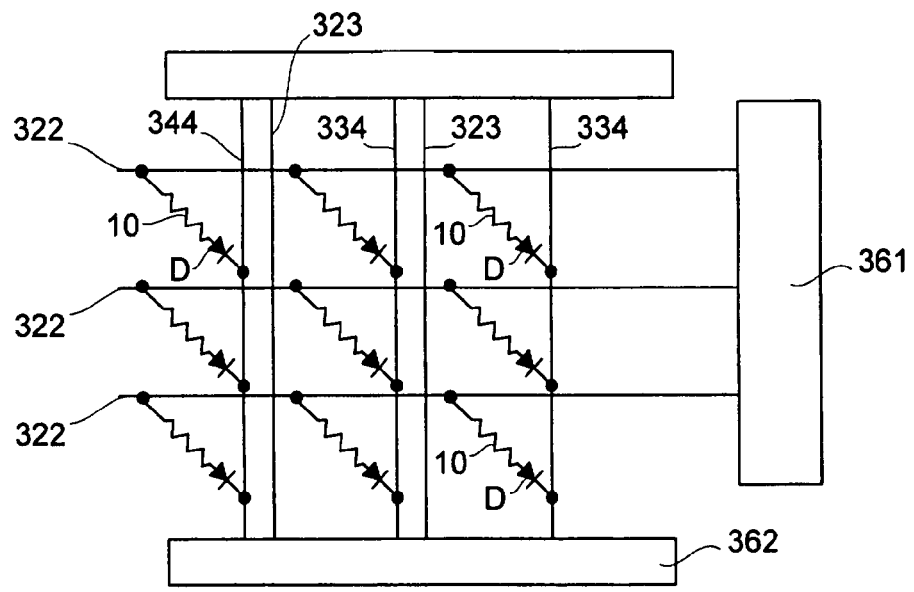
FIG. 17 is a view illustrating another magnetic memory matrix according to the present invention.

FIG. 17 is a view illustrating another embodiment of the magnetic memory matrix according to the present invention. In this case, a bit line 322 and a word line 334 which are arranged in matrix are selected by decoders 360, 361, respectively, so that a specific memory cell in the array is selected. Each memory cell is configured such that the magneto-resistance effect film 10 and a diode D is connected in series. Here, the diode D plays a role of preventing a sense current from detouring in the memory cell other than the selected magneto-resistance effect film 10. A writing is performed by a magnetic field generated by flowing the writing current in the specific bit line 322 and the word line 323, respectively.

Figure 18:
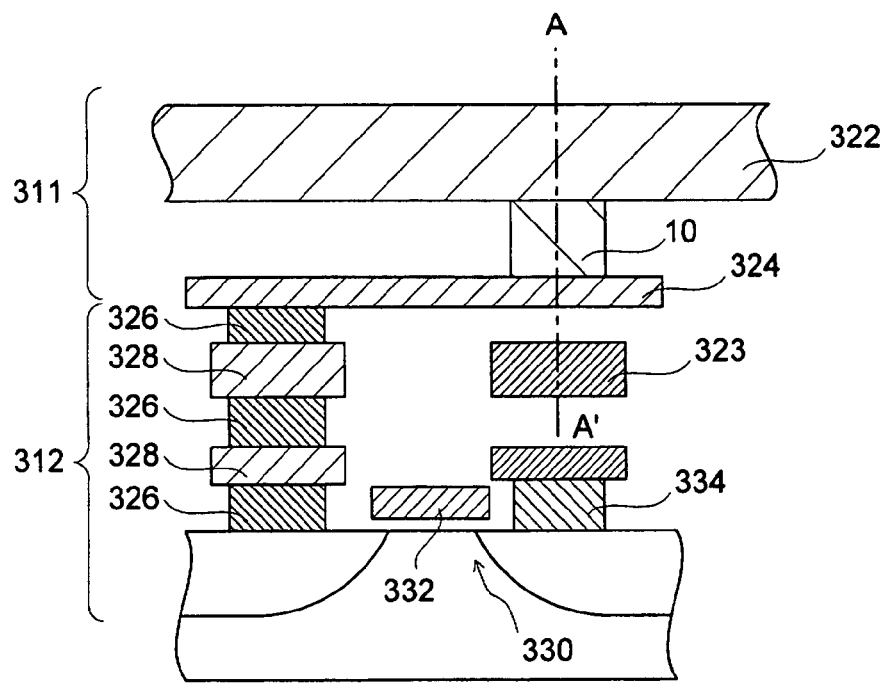
FIG. 18 is a cross sectional view illustrating an essential part of the magnetic memory.
Figure 19:
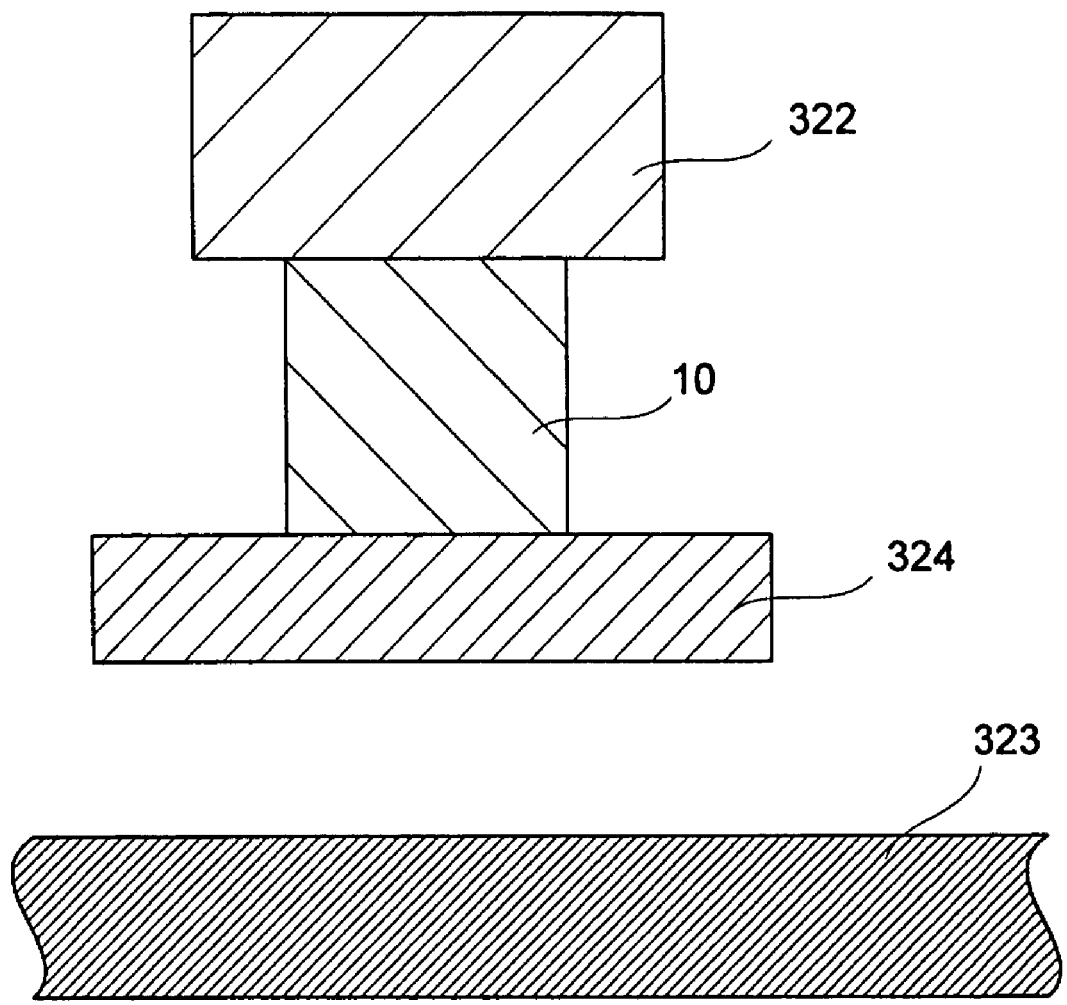
FIG. 19 is a cross sectional view of the magnetic memory illustrated in FIG. 17, taken on line "A-A'".

FIG. 18 is a cross sectional view illustrating a substantial portion of the magnetic memory in an embodiment according to the present invention. FIG. 19 is a cross sectional view of the magnetic memory illustrated in FIG. 18, taken on line "A-A'". The configuration shown in these drawings corresponds to a 1-bit memory cell included in the magnetic memory shown in FIG. 16 or FIG. 17. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current path between the magneto-resistance effect film 10 and the wiring 334.

Further, below the magneto-resistance effect film 10, a write wiring 323 is provided in the direction substantially orthogonal to the wiring 322. These write wirings 322, 323 can be formed of, for example, aluminum (Al), copper (Cu), tungsten (W), tantalnum (Ta) or an alloy containing any of these elements.

In the memory cell of such a configuration, when writing bit information into the magneto-resistance effect element 10, a writing pulse current is flowed in the wirings 322, 323, and a synthetic magnetic field induced by the writing current is applied to appropriately invert the magnetization of a recording layer of the magneto-resistance effect element 10.

Further, when reading out the bit information, a sense current is flowed through the magneto-resistance effect element 10 including the magnetic recording layer and a lower electrode 324 to measure a resistance value of or a fluctuation in the resistance values of the magneto-resistance effect element 10.

The magnetic memory according to the embodiment can assure writing and reading by surely controlling the magnetic domain of the recording layer even though the cell is miniaturized in size, with the use of the magneto-resistance effect element (CCP-CPP element) according to the above-described embodiment.

ANOTHER EMBODIMENT

Although the present invention was described in detail with reference to the above examples, this invention is not limited to the above disclosure and every kind of variation and modification may be made without departing from the scope of the present invention.

The concrete structure of the magneto-resistance effect element, and the shape and material of the electrodes, the magnetic field biasing films and the insulating layer can be appropriately selected among the ones well known by the person skilled in the art. In these cases, the intended magneto-resistance effect element according to the present invention can be obtained so as to exhibit the same effect/function as described above.

When the magneto-resistance effect element is applied for a reproducing magnetic head, the detecting resolution of the magnetic head can be defined by applying magnetic shielding for the upper side and the lower side of the magneto-resistance effect element. Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device. The magnetic recording/reproducing device may be a so-called stationary type magnetic device where a specific recording medium is installed therein or a so-called removable type magnetic device where a recording medium can be replaced.

What is claimed is:

1. A method for manufacturing a magneto-resistance effect element, comprising:
    forming a first magnetic layer;
    forming a first metallic layer, on said first magnetic layer, mainly containing an element selected from the group consisting of Cu, Au, Ag;
    forming a functional layer, on said first metallic layer, mainly containing an element selected from the group consisting of Si, Hf, Ti, Mo, W, Nb, Mg, Cr and Zr;
    forming a second metallic layer, on said functional layer, mainly containing Al;
    after forming said second metallic layer, treating said second metallic layer by means of pre-ion treatment and oxidizing, nitriding or oxynitiriding so as to form a current confined layer including an insulating layer and a current path with a conductor passing a current through said insulating layer; and
    forming, on said current confined layer, a second magnetic layer.

2. The method according to claim 1, wherein the pre-ion treatment comprises irradiation using an inert gas.

3. The method according to claim 1, wherein the pre-ion treatment comprises irradiation using argon.

4. A method for manufacturing a magneto-resistance effect element, comprising:
    forming a first magnetic layer;
    forming a first metallic layer, on said first magnetic layer, mainly containing an element selected from the group consisting of Cu, Au, Ag;
    forming a second metallic layer, on said first metallic layer, mainly containing Al;
    forming a functional layer, on said second metallic layer, mainly containing an element selected from the group consisting of Si, Hf, Ti, Mo, W, Nb, Mg, Cr and Zr;
    after forming said second metallic layer, treating said second metallic layer and said functional layer by means of pre-ion treatment and oxidizing, nitriding or oxynitiriding so as to form a current confined layer including an insulating layer and a current path with a conductor passing a current through said insulating layer; and
    forming, on said current confined layer, a second magnetic layer.

5. The method according to claim 4, wherein the pre-ion treatment comprises irradiation using an inert gas.

6. The method according to claim 4, wherein the pre-ion treatment comprises irradiation using argon.

7. A method for manufacturing a magneto-resistance effect element, comprising:
    forming a first magnetic layer;
    forming a first metallic layer, on said first magnetic layer, mainly containing an element selected from the group consisting of Cu, Au, Ag;
    forming a second metallic layer, on said first metallic layer, mainly containing Al;
    after forming said second metallic layer, treating said second metallic layer by means of pre-ion treatment and oxidizing, nitriding or oxynitiriding so as to form a current confined layer including an insulating layer and a current path with a conductor passing a current through said insulating layer;
    forming a functional layer, on said current confined layer, mainly containing an element selected from the group consisting of Al, Si, Hf, Ti, Mo, W, Nb, Mg, Cr and Zr; and
    forming, on said functional layer, a second magnetic layer.

8. The method according to claim 7, wherein the pre-ion treatment comprises irradiation using an inert gas.

9. The method according to claim 7, wherein the pre-ion treatment comprises irradiation using argon.

10. A method for manufacturing a magneto-resistance effect element, comprising:
    forming a first magnetic layer;
    forming a first metallic layer, on said first magnetic layer, mainly containing an element selected from the group consisting of Cu, Au, Ag;
    forming a first functional layer, on said first metallic layer, mainly containing an element selected from the group consisting of Si, Hf, Ti, Mo, W, Nb, Mg, Cr and Zr;
    forming a second metallic layer, on said first functional layer, mainly containing Al;
    forming a second functional layer, on said second metallic layer, mainly containing an element selected from the group consisting of Si, Hf, Ti, Mo, W, Nb, Mg, Cr and Zr;
    after forming said second metallic layer, treating said second functional layer and said second metallic layer by means of pre-ion treatment and oxidizing, nitriding or oxynitiriding so as to form a current confined layer including an insulating layer and a current path with a conductor passing a current through said insulating layer; and forming, on said current confined layer, a second magnetic layer.

11. The method according to claim 10, wherein the pre-ion treatment comprises irradiation using an inert gas.

12. The method according to claim 10, wherein the pre-ion treatment comprises irradiation using argon.

13. A method for manufacturing a magneto-resistance effect element, comprising:

forming a first magnetic layer;

forming a first metallic layer, on said first magnetic layer, mainly containing an element selected from the group consisting of Cu, Au, Ag;

forming a first functional layer, on said first metallic layer, mainly containing an element selected from the group consisting of Si, Hf, Ti, Mo, W, Nb, Mg, Cr and Zr;

forming a second metallic layer, on said first functional layer, mainly containing Al;

after forming said second metallic layer, treating said second metallic layer by means of pre-ion treatment and oxidizing, nitriding or oxynitiriding so as to form a current confined layer including an insulating layer and a current path with a conductor passing a current through said insulating layer;

forming a second functional layer, on said current confined layer, mainly containing an element selected from the group consisting of Al, Si, Hf, Ti, Mo, W, Nb, Mg, Cr and Zr; and forming, on said second functional layer, a second magnetic layer.

14. The method according to claim 13, wherein the pre-ion treatment comprises irradiation using an inert gas.

15. The method according to claim 13, wherein the pre-ion treatment comprises irradiation using argon.

* * * * *